(12) United States Patent
Tsao et al.

(10) Patent No.: US 10,121,901 B2
(45) Date of Patent: Nov. 6, 2018

(54) PIXEL STRUCTURE WITH ISOLATOR AND METHOD FOR FABRICATING THE SAME

(71) Applicant: Au Optronics Corporation, Hsinchu (TW)

(72) Inventors: Fu-Chun Tsao, Taoyuan (TW); Kuo-Yu Huang, Hsinchu County (TW); Maw-Song Chen, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 15/216,700

(22) Filed: Jul. 22, 2016

(65) Prior Publication Data

US 2017/0033235 A1 Feb. 2, 2017

(30) Foreign Application Priority Data

Jul. 31, 2015 (TW) .............................. 104124927 A

(51) Int. Cl.
| | |
|---|---|
| H01L 29/12 | (2006.01) |
| H01L 29/786 | (2006.01) |
| H01L 27/12 | (2006.01) |
| G02F 1/1333 | (2006.01) |
| G02F 1/1362 | (2006.01) |
| G02F 1/1343 | (2006.01) |

(52) U.S. Cl.
CPC .. H01L 29/78618 (2013.01); G02F 1/133345 (2013.01); G02F 1/136227 (2013.01); H01L 27/124 (2013.01); H01L 27/1248 (2013.01); H01L 27/1255 (2013.01); H01L 27/1288 (2013.01); G02F 2001/134372 (2013.01)

(58) Field of Classification Search
CPC .......... H01L 29/78618; H01L 27/1288; H01L 27/1255

See application file for complete search history.

(56) References Cited

U.S. PATENT DOCUMENTS

| | | | |
|---|---|---|---|
| 3,874,942 A * | 4/1975 | Negishi ................. | G03G 5/147 |
| | | | 430/67 |
| 6,259,202 B1 | 7/2001 | Sturm et al. | |
| 9,104,060 B2 | 8/2015 | Lee et al. | |
| 2012/0217493 A1 | 8/2012 | Lee et al. | |
| 2013/0087794 A1 | 4/2013 | Kwack | |

(Continued)

FOREIGN PATENT DOCUMENTS

| | | |
|---|---|---|
| TW | 201329596 | 7/2013 |
| TW | 201435438 | 9/2014 |

*Primary Examiner* — Ismail Muse
(74) *Attorney, Agent, or Firm* — JCIPRNET

(57) ABSTRACT

A pixel structure including an active device, a first protection layer, a first electrode, an isolator, a second protection layer and a second electrode is provided. The active device includes a gate, a source and a drain. The first protection layer covers the active device and has a first opening above the drain. The first electrode is disposed above the first protection layer. The first electrode has a side wall corresponding to the first opening. The isolator covers the side wall of the first electrode. The second protection layer covers the first electrode. The second electrode is disposed on the second protection layer, electrically connected to the drain through the first opening, and electrically isolated from the first electrode by the second protection layer and the isolator.

17 Claims, 22 Drawing Sheets

(56) References Cited

U.S. PATENT DOCUMENTS

| | | |
|---|---|---|
| 2014/0117361 A1 | 5/2014 | Park et al. |
| 2014/0239267 A1* | 8/2014 | Byun ................ H01L 29/66742 |
| | | 257/40 |
| 2014/0253850 A1 | 9/2014 | Lee et al. |
| 2015/0072484 A1* | 3/2015 | Park ...................... H01L 27/124 |
| | | 438/158 |
| 2016/0322399 A1* | 11/2016 | Kim ...................... G02F 1/1333 |
| 2017/0146834 A1* | 5/2017 | Tak ....................... G02F 1/1339 |

* cited by examiner

PIXEL STRUCTURE WITH ISOLATOR AND METHOD FOR FABRICATING THE SAME

CROSS-REFERENCE TO RELATED APPLICATION

This application claims the priority benefit of Taiwan application serial no. 104124927, filed on Jul. 31, 2015. The entirety of the above-mentioned patent application is hereby incorporated by reference herein and made a part of this specification.

BACKGROUND OF THE INVENTION

1. Field of the Invention

The invention relates to an electronic structure and a method for fabricating the same, and particularly relates to a pixel structure and a method for fabricating the same.

2. Description of Related Art

Since display panels exhibit advantageous properties such as lower power consumption as compared to cathode ray tube (CRT) displays, the display panels have been broadly used in various electronic devices. Through the rapid development of science and technology, the consumers are no longer satisfied with the display panels that merely save power. Further to the properties of smaller size and lower power consumption, the consumers are also looking forward to display panels having a higher resolution. Taking medium and small-sized display panels (such as display panels used in mobile phones and satellite navigation devices) as an example, the consumers prefer each pixel structure to have a higher aperture ratio and smaller size, so as to realize lower power consumption and higher resolution at the same time.

Taking the fringe-field switching (FFS) display panel as an example, the pixel structure thereof includes an active device having a source, a gate, and a drain, a first protection layer covering the active device, a first electrode located above the first protection layer, a second protection layer covering the first electrode, and a second electrode located on the second protection layer. The second protection layer has an opening located beside the first electrode and exposing the drain. The second electrode fills into the opening and is electrically connected to the drain of the active device. To allow a pixel structure of a display panel to have a higher aperture ratio, which makes power consumption lower, the first electrode needs to be close to the drain of the active device as much as possible. In other words, the first electrode needs to be close to the opening of the second protection layer exposing the drain. However, as the requirement on resolution becomes stricter, namely the size of each pixel structure is reduced, the predetermined distance between the boundary of the first electrode and the opening of the second protection layer is forced to be reduced. Consequently, the alignment error between the second protection layer and the first electrode may easily exceed the predetermined distance, making the opening of the second protection layer expose the first electrode, which results in a short circuit between the first electrode and the second electrode when the second electrode fills into the opening of the second protection layer. The yield rate of the pixel structure is thus influenced.

SUMMARY OF THE INVENTION

The invention provides a pixel structure capable of improving a yield rate as compared to that of a conventional pixel structure.

The invention provides a method for fabricating a pixel structure capable of fabricating a pixel structure with a high yield rate.

The invention provides a pixel structure including an active device, a first protection layer, a first electrode, an isolator, a second protection layer, and a second electrode. The active device includes a gate, a source, and a drain. The first protection layer covers the active device and has a first opening above the drain. The first electrode is located above the first protection layer. The first electrode has a sidewall at a position corresponding to the first opening. The isolator covers the sidewall of the first electrode. The second protection layer covers the first electrode and the isolator. The second electrode is located on the second protection layer, and electrically connected to the drain of the active device through the first opening. The second electrode is electrically isolated from the first electrode by the second protection layer and the isolator.

The invention provides a method for fabricating a pixel structure. The method includes steps as follows. An active device is formed on a substrate. The active device includes a gate, a source, and a drain. A first protection layer is formed on the active device. A first electrode is formed above the first protection layer. A second protection layer is formed on the first electrode. The second protection layer and the first electrode are patterned to form an opening exposing the first protection layer above the drain. The first electrode has a sidewall at the opening. An isolator is formed on the sidewall of the first electrode. The first protection layer exposed by the opening is removed, so as to form a first opening in the first protection layer to expose the drain. A second electrode is formed on the second protection layer. The second electrode is electrically connected to the drain through the first opening, and the second electrode is electrically isolated from the first electrode by the second protection layer and the isolator.

Based on above, in the pixel structure and the method for fabricating the pixel structure according to the embodiments of the invention, the isolator is formed on the sidewall of the opening of the first electrode, and the second electrode above the first electrode is electrically isolated from the first electrode by the second protection layer and the isolator. Therefore, there is hardly a short circuit between the first electrode and the second electrode. Consequently, the yield rate and the performance of the pixel structure become higher.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
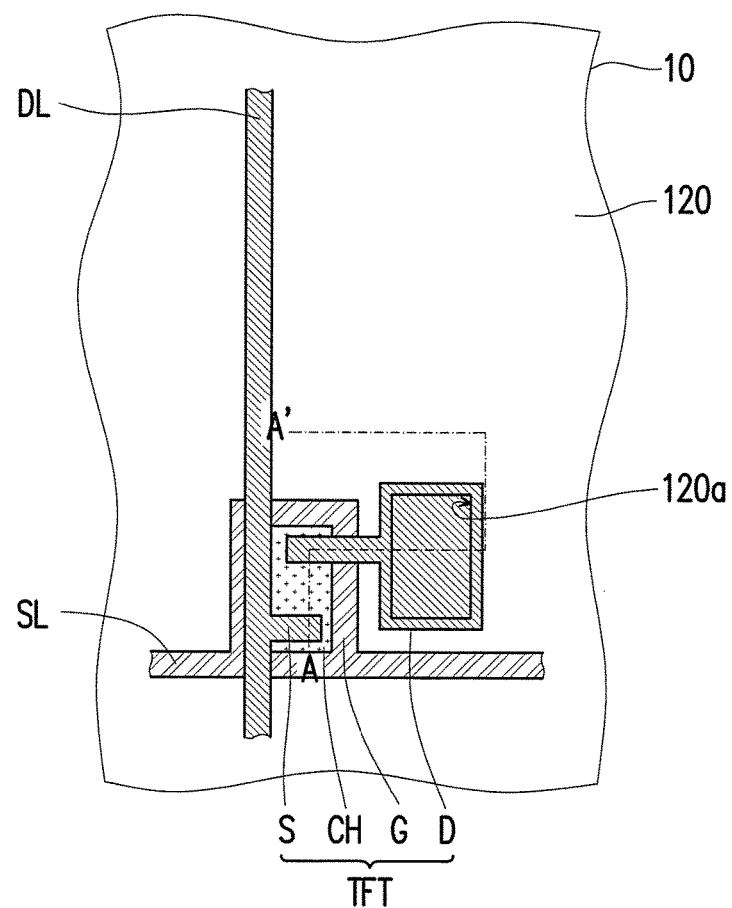
FIGS. 1A to 1G are schematic top views illustrating a method for fabricating a pixel structure according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1G are schematic top views illustrating a method for fabricating a pixel structure according to an embodiment of the invention. FIGS. 2A to 2G are schematic cross-sectional views illustrating a method for fabricating a pixel structure according to an embodiment of the invention. In particular, FIGS. 2A and 2G are respectively cross-sectional views along a cross-sectional line A-A' in FIGS. 1A to 1G. In the following, the method for fabricating the pixel structure according to an embodiment of the invention is described with reference to FIGS. 1A to 1G and FIGS. 2A to 2G.

Figure 2A:
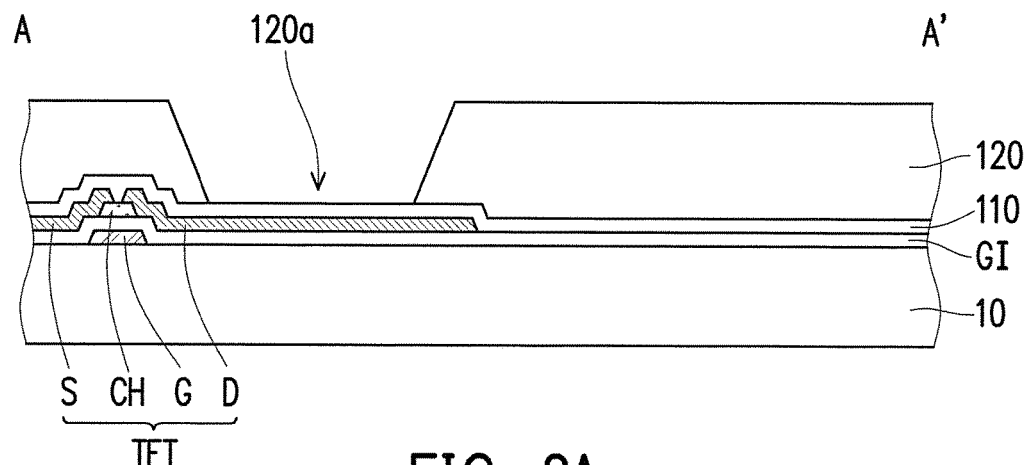
FIGS. 2A to 2G are schematic cross-sectional views illustrating a method for fabricating a pixel structure according to an embodiment of the invention.

Firstly, referring to FIGS. 1A and 2A, a substrate 10 is provided. The substrate 10 carries a pixel structure. The substrate 10 may be formed of glass, quartz, an organic polymer, an opaque/reflective material (e.g., a conductive material, a wafer, a ceramic material, etc.,) or other suitable materials.

Then, an active device TFT is formed on the substrate 10. Specifically, in this embodiment, a gate G and a scan line SL (shown in FIG. 1A) electrically connected to the gate G may be formed in advance. The gate G and the scan line SL are normally formed of a metallic material. However, the invention is not limited thereto. In other embodiments, the gate G and the scan line SL may also be formed of other conductive materials, such as an alloy, nitride of a metallic material, oxide of a metallic material, oxynitride of a metallic material, or a stack layer of a metallic material and other conductive materials. Then, a gate insulating layer GI (shown in FIG. 2A) is formed on the gate G. The gate insulating layer GI covers the gate G, the scan line SL and the substrate 10. The gate insulating layer GI may be formed of an inorganic material, such as silicon oxide, silicon nitride, silicon oxynitride, or a stack layer of at least two of the aforementioned materials, an organic material, or a combination thereof. Then, a channel layer CH is formed on the gate insulating layer GI. The channel layer CH may be formed of amorphous silicon, low-temperature polycrystalline silicon, microcrystalline silicon, monocrystalline silicon, an organic semiconductor material, a metal oxide semiconductor material (e.g., indium gallium zinc oxide, indium zinc oxide, indium germanium zinc oxide, etc.,), or other suitable materials. Then, at two sides of the channel layer CH, a source S and a drain D electrically connected to the two sides of the channel layer CH and a data line DL electrically connected to the source S (shown in FIG. 1A) are formed. Accordingly, the active device TFT is completed. Materials suitable for the source S, the drain D, and the data line DL may be the materials suitable for the gate G. Thus, the repeated contents will not be reiterated in the following. It should be noted that, even though the method for fabricating the active device TFT is described by adopting a method for fabricating a bottom gate thin film transistor as an example, the invention is not limited thereto. In other embodiments, a method for fabricating a top gate thin film transistor may also be adopted to form the active device TFT.

Referring to FIGS. 1A and 2A, then, a first protection layer 110 is formed on the active device TFT. The first protection layer 110 covers the active device TFT and the gate insulating layer GI. The first protection layer 110 may be formed of an inorganic material (e.g., silicon oxide, silicon nitride, silicon oxynitride, or a stack layer of at least two of the aforementioned materials), an organic material, or a combination thereof. Then, a planar layer 120 is formed on the first protection layer 110. The planar layer 120 has a second opening 120a. The second opening 120a exposes a portion of the first protection layer 110 above the drain D. The planar layer 120 may be formed of an inorganic material (e.g., silicon oxide, silicon nitride, silicon oxynitride, or a stack layer of at least two of the aforementioned materials), an organic material, or a combination thereof.

Figure 1B:
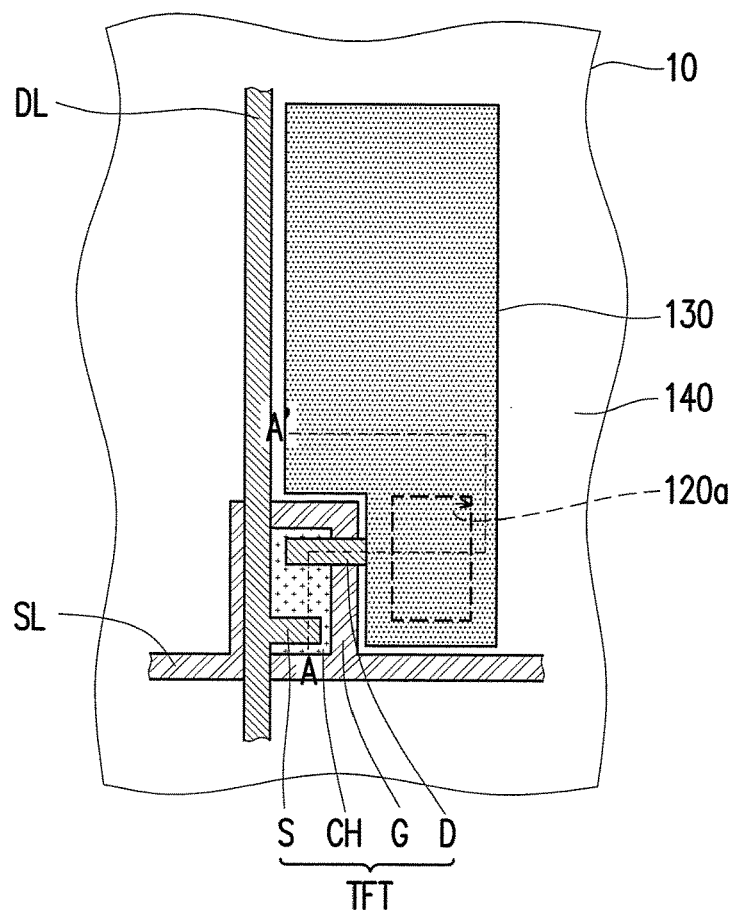
Figure 2B:
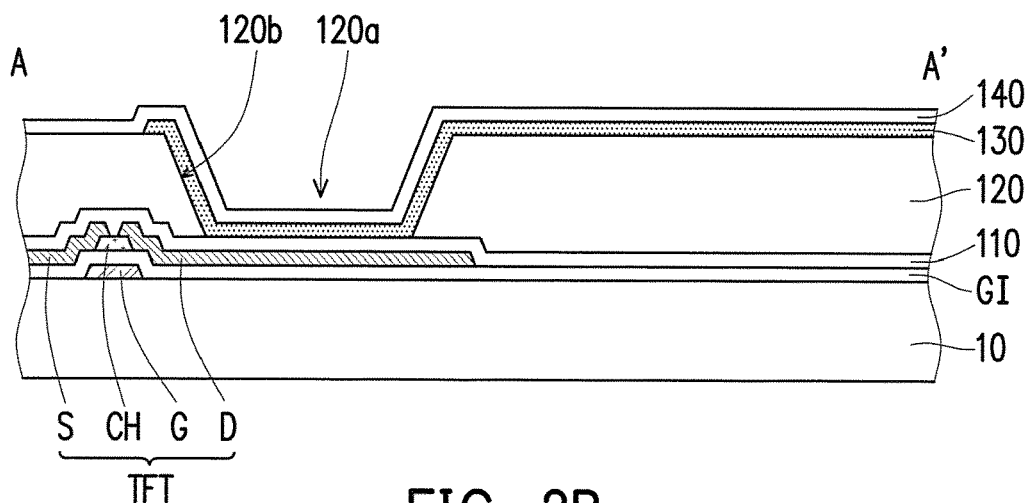

Referring to FIGS. 1B and 2B, then, a patterned first electrode 130 is formed on the planar layer 120, and a second protection layer 140 is formed on the first electrode 130. The second protection layer 140 conformally covers the first electrode 130. The first electrode 130 and the second protection layer 140 cover the second opening 120a of the planar layer 120. More specifically, the second opening 120a of the planar layer 120 has a sidewall surface 120b (shown in FIG. 2B). Besides, in addition to covering the sidewall surface 120b of the second opening 120a, the first electrode 130 and the second protection layer 140 further extends to a bottom portion of the second opening 120a, so as to cover the portion of the first protection layer 110 exposed by the second opening 120a. The first electrode 130 may be formed of a transparent conductive material, a reflective conductive material, or a combination thereof. The transparent conductive material is indium tin oxide, indium zinc oxide, aluminum tin oxide, aluminum zinc oxide, indium germanium zinc oxide, a stack layer of at least two of the aforementioned materials, or other suitable materials. The reflective conductive material may be metal (e.g., aluminum, etc.) or other suitable materials. The second protection layer 140 may be formed of an inorganic material (e.g., silicon oxide, silicon nitride, silicon oxynitride, or a stack layer of at least two of the aforementioned materials), an organic material, or a combination thereof.

Figure 1C:
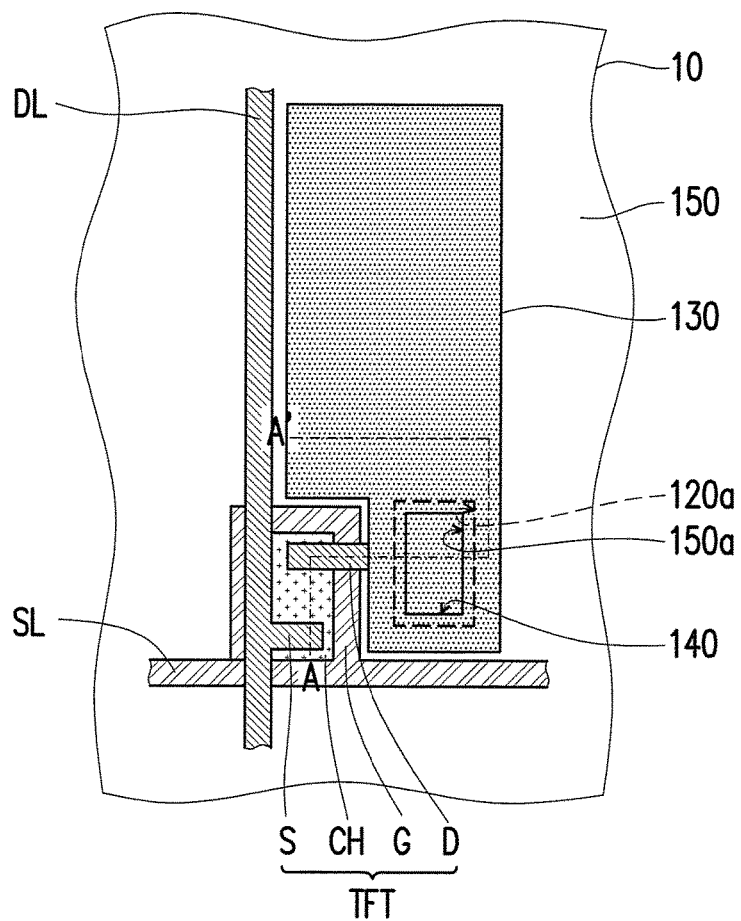
Figure 2C:
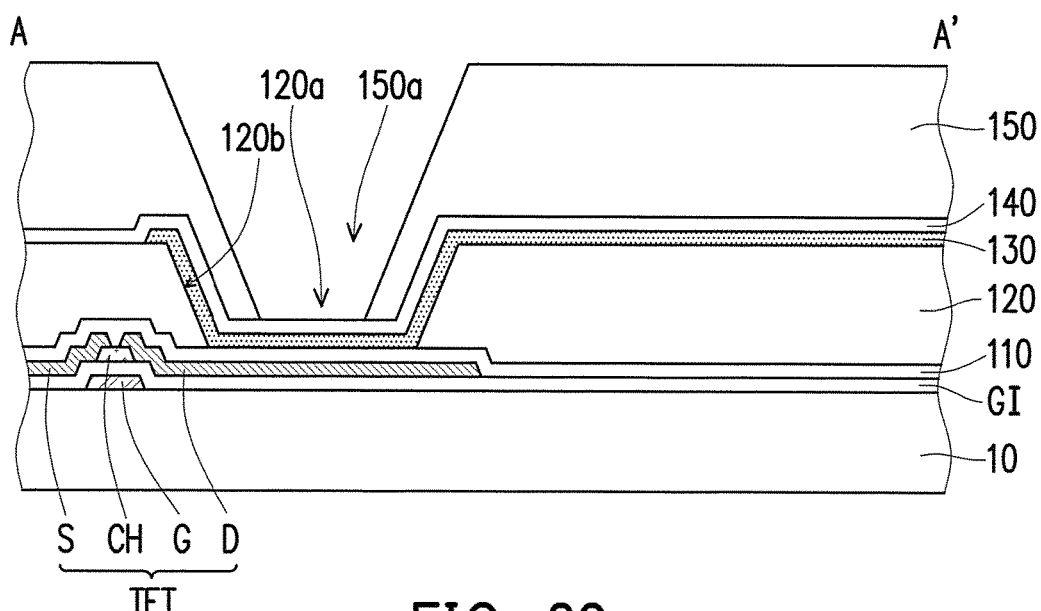

Referring to FIGS. 1C and 2C, then, a photoresist 150 is formed on the second protection layer 140. The photoresist 150 has an opening 150a. The opening 150a is overlapped with the second opening 120a of the planar layer 120 and the drain D of the active device TFT. More specifically, in this embodiment, a size of the opening 150a of the photoresist 150 is smaller than a size of the second opening 120a of the planar layer 120. The boundary of the opening 150a of the photoresist 150 may be completely located within the boundary of the second opening 120a of the planar layer 120. However, the invention is not limited thereto. In other embodiments, it is also possible that a portion of the boundary of the opening 150a is located within the boundary of the second opening 120a, and another portion of the boundary of the opening 150a is located outside the boundary of the second opening 120a. However, the invention does not intend to impose a limitation in this regard.

Figure 1D:
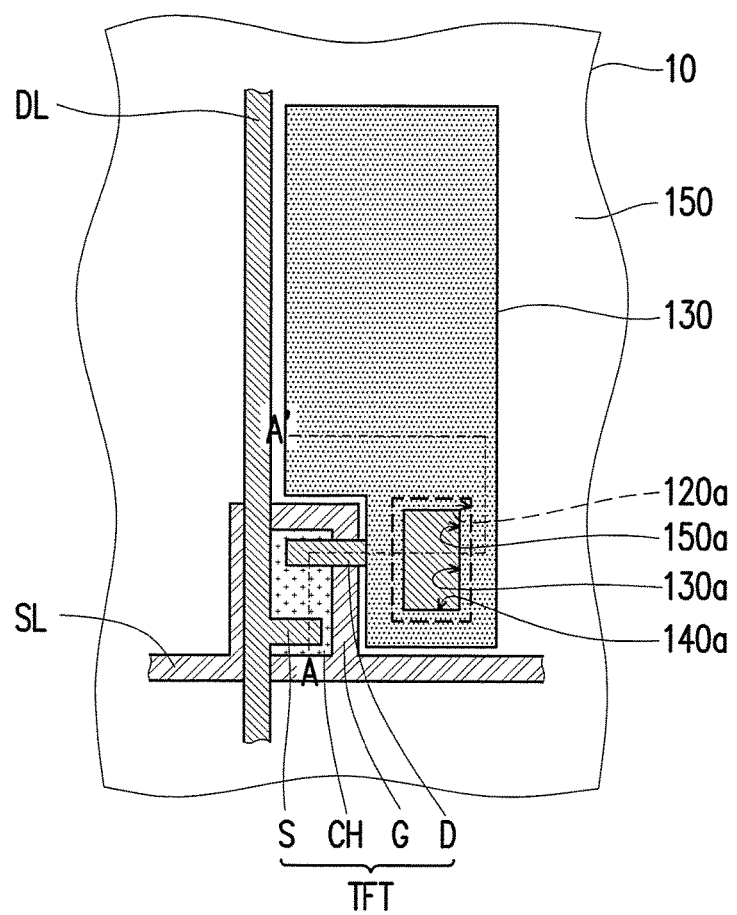
Figure 2D:
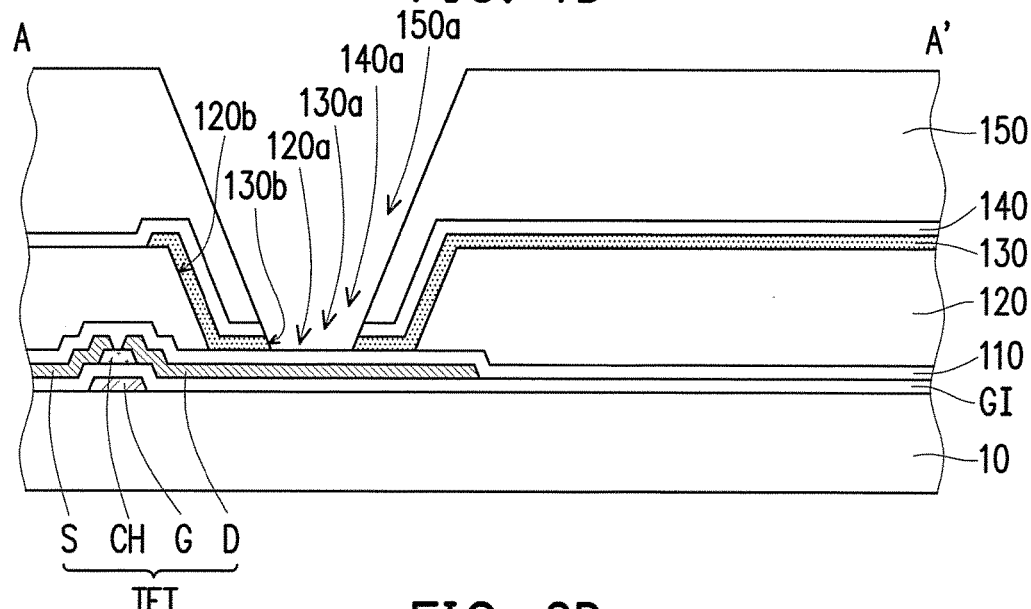

Referring to FIGS. 1D and 2D, then, a portion of the second protection layer 140 and a portion of the first electrode 130 located at the bottom portion of the second opening 120a are removed via the first opening 150a, and a portion of the first electrode 130 and a portion of the second protection layer 140 located at the sidewall surface 120b of the second opening 120a remain. More specifically, the photoresist 150 may be used as a mask to remove the portion of the second protection layer 140 exposed by the opening 150a, such that the second protection layer 140 has an opening 140a substantially aligned to the opening 150a. A size of the opening 140a of the second protection layer 140 is smaller than a size of the second opening 120a of the planar layer 120. At least a portion of the boundary of the opening 140a may be located within the boundary of the second opening 120a of the planar layer 120. In other words, when the opening 140a is formed, at least a portion of the second protection layer 140 remains in the second opening 120a and covers the sidewall surface 120b of the second opening 120a. In this embodiment, a dry etching process may be performed to remove the portion of the second protection layer 140 exposed by the opening 150a. However, the invention is not limited thereto. In other embodiments, other suitable processes may also be performed. Then, using the same photoresist 150 as a mask, a portion of the first electrode 130 exposed by the openings 150a and 140a is removed, such that the first electrode 130 has an opening 130a substantially aligned to the openings 150a and 140a. At least a portion of the boundary of the opening 130a is located within the boundary of the second opening 120a. In other words, when the opening 130a is formed, at least a portion of the first electrode 130 remains within the second opening 120a and covers the sidewall surface 120b of the second opening 120a. In this embodiment, a wet etching process may be performed to remove the portion of the first electrode 130 exposed by the openings 150a and 140a. However, the invention is not limited thereto. In other embodiments, other suitable processes may also be performed.

It should be mentioned that, as shown in FIG. 2D, the opening 140a of the second protection layer 140 is formed by using the photoresist 150 as a mask, while the opening 130a of the first electrode 130 is formed by using the photoresist 150 and the second protection layer 140 having the opening 140a as masks. In other words, the opening 140a of the second protection layer 140 and the opening 130a of the first electrode 130 are self-aligned. Thus, unlike the conventional art that keeps a long distance, a distance between the boundary of the opening 140a of the second protection layer 140 and the boundary of the first electrode 130 closest to the active device TFT (e.g., positions indicated by the reference numerals 130a and 130b) may be very close. In this way, a short circuit between the first electrode and the second electrode due to an alignment offset between the opening of the second protection layer and the first electrode may be prevented. Thus, an area where the first electrode 130 is distributed may increase, so as to improve an aperture ratio of the pixel structure. Besides, since the opening 140a of the second protection layer 140 and the opening 130a of the first electrode 130 are formed by using the same photoresist 150 as a mask, namely the opening 140a of the second protection layer 140 and the opening 130a of the first electrode 130 are formed by using the same photomask, it does not require two photomasks to fabricate the openings of the second protection layer and the first electrode. Thus, the method for fabricating the pixel structure according to the embodiment of the invention has the advantages of saving the masks used and reducing the fabricating cost of the pixel structure.

Figure 1E:
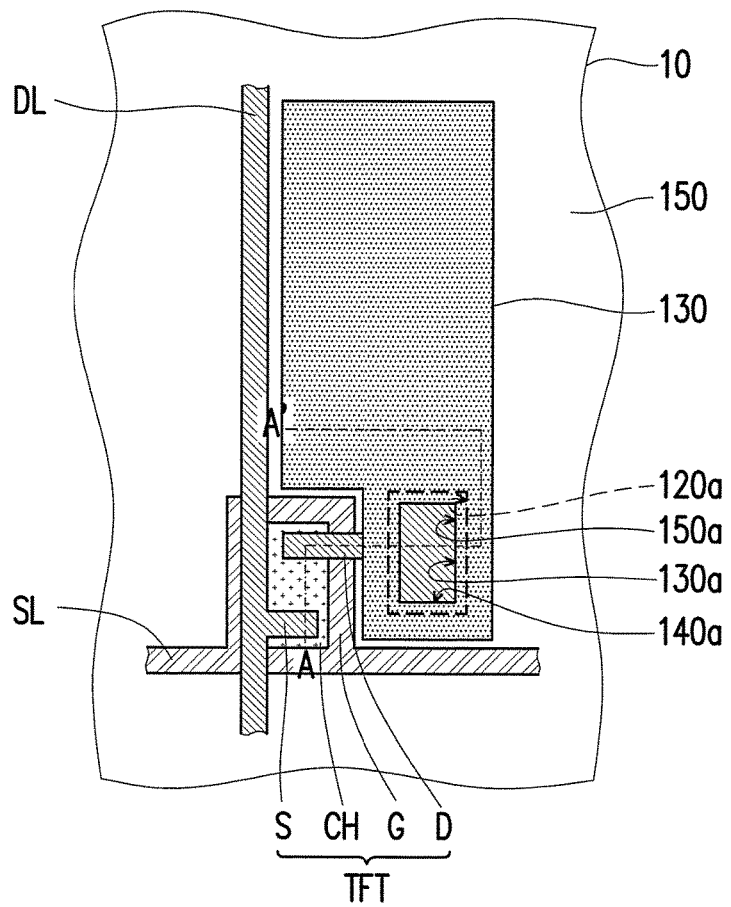
Figure 2E:
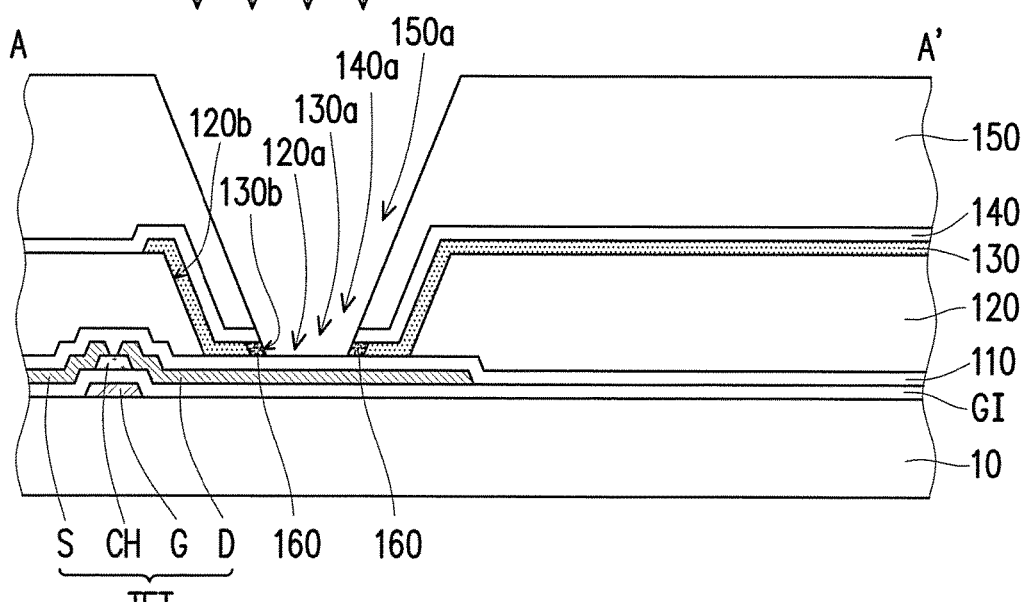

Referring to FIGS. 1D and 2D, the openings 130a, 140a, and 150a expose a portion of the first protection layer 110 above the drain D. The first electrode 130 has a sidewall 130b at the opening 130a. The sidewall 130b defines the opening 130a. Referring to FIGS. 1E and 2E, then, an isolator 160 is formed on the sidewall 130b of the first electrode 130. Specifically, in this embodiment, after the opening 130a is formed and the sidewall 130b of the first electrode 130 is exposed, a passivation process may be performed, such that the sidewall 130b of the first electrode 130 is passivated to form the isolator 160 that is almost insulation. The passivation process allows an oxidation reduction reaction, an oxidation reaction, a reduction reaction or other reactions to occur in the sidewall 130b of the first electrode 130 that is exposed, such that the exposed sidewall 130b of the first electrode 130 may be converted into the isolator 160 that are almost insulation. The passivation process is a $H_2$ plasma treatment, a $NH_3$ plasma treatment, or a $SiH_4$ plasma treatment, for example, and other suitable gases may be optionally added during these plasma treatments. However, the invention is not limited thereto. The isolator 160 is formed by passivating the first electrode 130. Thus, the isolator 160 and the first electrode 130 may include the same element. For example, the isolator 160 may include zinc (Zn), titanium (Ti), or other suitable materials. In this embodiment a resistance of the isolator 160 may be greater than $10^{10}$ Ω–cm. However, the invention is not limited thereto.

Table 1 in the following lists the resistances of the first electrode 130 after a $H_2$ plasma treatment is performed to the first electrode 130 (e.g., indium tin oxide) using plasma sources with different powers. Referring to Table 1, when the power of the plasma source is high enough (e.g., 5000 W), the resistance of the passivated first electrode 130 may be greater than $10^{10}$ Ω–cm, and exceed $3.4*10^{13}$ Ω–cm, for example. The resistance of $3.4*10^{13}$ Ω–cm is greater than the resistance of $10^9$~$10^{10}$ Ω–cm of wood that is almost insulation, and slightly lower than the resistance of $10^{15}$ Ω–cm of acrylic resin that is almost insulation. In other words, the experimental data shown in Table 1 below prove that, by suitably setting a processing condition of the passivation process, the sidewall 130b of the first electrode 130 is able to be converted into the isolator 160 that is almost insulation.

TABLE 1

| Power (W) of Plasma Source | Resistance (Ω-cm) of Indium Tin Oxide |
|---|---|
| 1000 | $4.7*10^1$ |
| 3000 | $7.7*10^4$ |
| 5000 | $3.4*10^{13}$ |

Figure 1F:
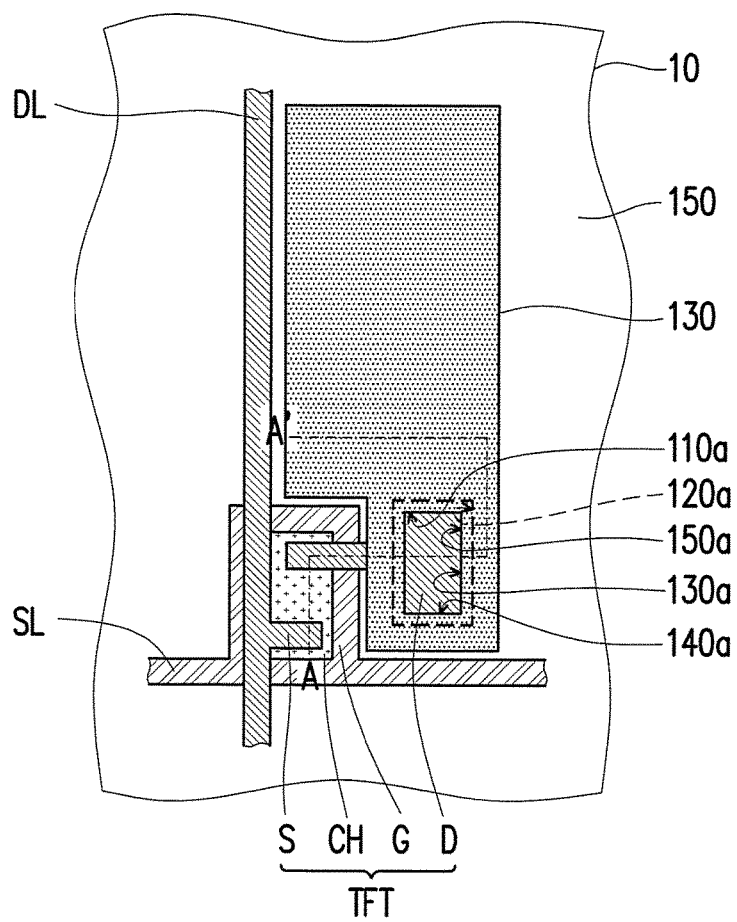
Figure 2F:
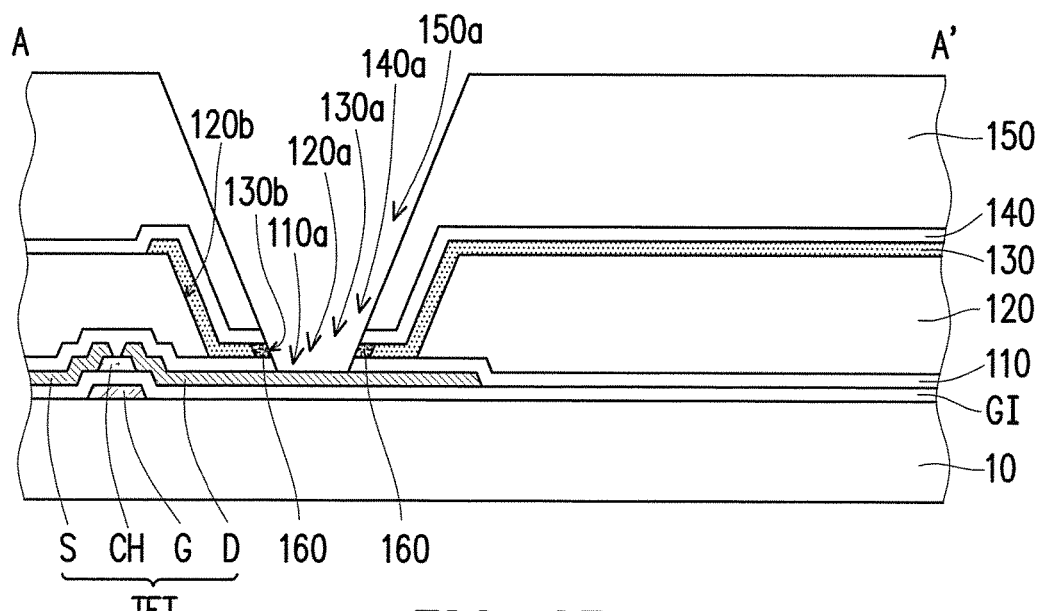
Figure 2G:
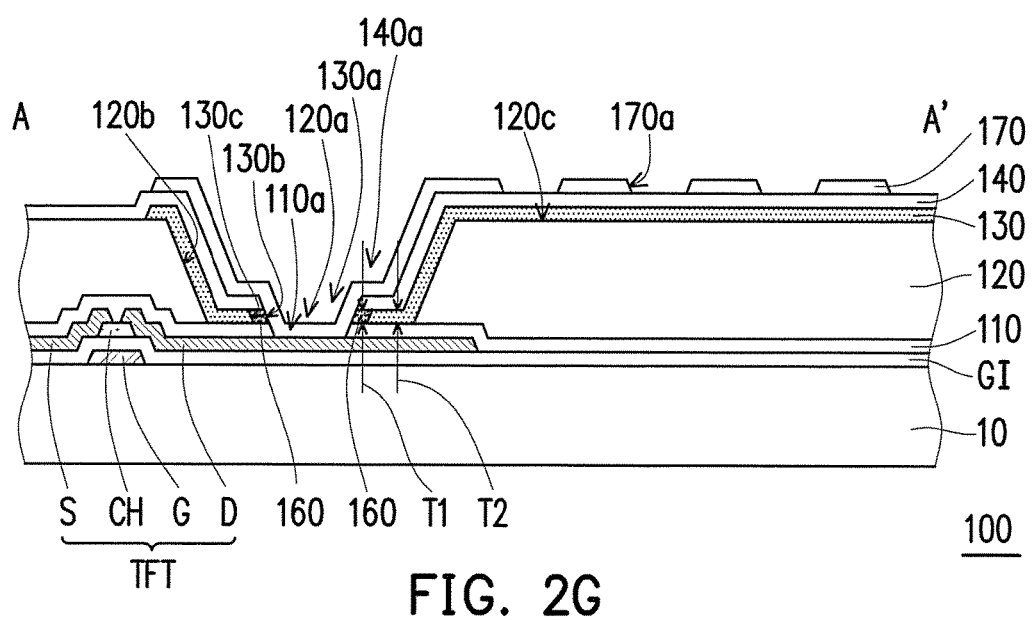

Referring to FIGS. 1F and 2F, then, a portion of the first protection layer 110 exposed by the openings 130a, 140a, and 150a is removed, so as to form a first opening 110a in the first protection layer 110. The first opening 110a exposes the drain D. In this embodiment, the photoresist 150 may be used as a mask and selectively performs a dry etching process to remove the portion of the first protection layer 110 exposed by the openings 130a and 140a, so as to form the first opening 110a. Since the first opening 110a and the openings 130a and 140a are formed by using the same photoresist 150, the first opening 110a and the openings 130a and 140a are substantially aligned to each other.

Figure 1G:
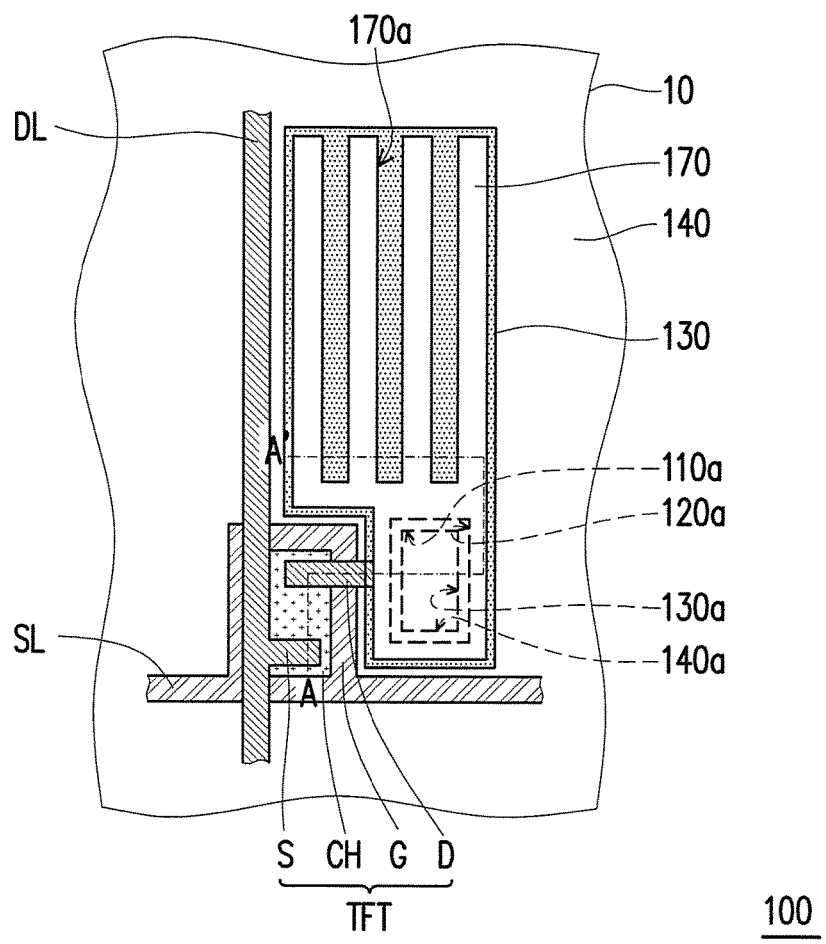

Referring to FIGS. 1F and 2F and FIGS. 1G and 2G, then, the photoresist 150 (shown in FIGS. 1F and 2F) is removed to expose the second protection layer 140 having the opening 140a. Referring to FIGS. 1G and 2G, then, a patterned second electrode 170 is formed on the second protection layer 140. The second electrode 170 is electrically connected with the drain D through the openings 140a and 130a and the first opening 110a. The second electrode 170 may further be electrically isolated from the first electrode 130 by the second protection layer 140 and the isolator 160. Accordingly, the pixel structure 100 of this embodiment is completed. Materials suitable for the second electrode 170 are similar to those suitable for the first electrode 130, and will thus not be repeated in the following.

Referring to FIGS. 1G and 2G, the pixel structure 100 includes the active device TFT, the first protection layer 110, the first electrode 130, the isolator 160, the second protection layer 140, and the second electrode 170. The active device TFT includes the gate G, the channel layer CH overlapped with the gate G, and the source S and drain D respectively electrically connected to two sides of the channel layer CH. The pixel structure 100 of this embodiment further includes the gate insulating layer GI located between the channel layer CH and the gate G. In this embodiment, the gate G is located below the channel layer CH. In other words, the active device TFT of this embodiment is a bottom gate thin film transistor. However, the invention is not limited thereto. In other embodiments, the active device TFT may also be a top gate thin film transistor or other active devices in a suitable form.

The first protection layer 110 covers the active device TFT. In other words, the active device TFT is located between the first protection layer 110 and the substrate 10. The first protection layer 110 has the first opening 110a. The first opening 110a is located above and exposes the drain D of the active device TFT. In this embodiment, the pixel structure 100 further includes the planar layer 120. A portion of the first protection layer 110 is located between the planar layer 120 and the drain D. The planar layer 120 has the second opening 120a. The second opening 120a is in communication with the first opening 110a and has the sidewall surface 120b. The second opening 120a and the first opening 110a jointly expose the drain D of the active device TFT. In this embodiment, the size of the second opening 120a of the planar layer 120 may be optionally greater than the size of the first opening 110a of the first protection layer 110, and the second opening 120a is overlapped with the first opening 110a. In other words, at least a portion of the boundary of the first opening 110a is located within the boundary of the second opening 120a. However, the invention is not limited thereto.

The first electrode 130 is located above the first protection layer 110. A portion of the planar layer 120 is located between the first electrode 130 and the first protection layer 110. The first electrode 130 has a sidewall 130c at a position corresponding to the first opening 110a of the first protection layer 110. In this embodiment, the sidewall 130c is an interface between the first electrode 130 and the isolator 160 having different resistances. In this embodiment, the first electrode 130 is located on the planar layer 120 and covers the sidewall surface 120b of the second opening 120a. An orthogonal projection of the sidewall 130c of the first electrode 130 on the substrate 10 is located between an orthogonal projection of the second opening 120a on the substrate 10 and an orthogonal projection of the first opening 110a on the substrate 10. However, the invention is not limited thereto.

The isolator 160 covers the sidewall 130c of the first electrode 130. The second protection layer 140 covers the first electrode 130 and the isolator 160. In this embodiment, the isolator 160 is sandwiched between the first protection layer 110, the second protection layer 140, and the first electrode 130. Since the isolator 160 is formed by passivating a portion of the first electrode 130, as shown in FIG. 1E, a thickness T1 of the isolator 160 may be substantially equal to a thickness T2 of the first electrode 130. However, the invention is not limited thereto. In other embodiments, the isolator may also be formed in other ways, and the isolator is not required to have the same thickness as that of the first electrode 130.

The second electrode 170 is located on the second protection layer 140, and extends along the second protection layer 140 to a position above the sidewall surface 120b of the planar layer 120. The second protection layer 140 is located between the first electrode 130 and the second electrode 170. The second electrode 170 is electrically connected to the drain D of the active device TFT through the first opening 110a of the first protection layer 110. More specifically, the second electrode 170 sinks into the second opening 120a of the planar layer 120 and fills into the openings 140a, 130a and the first opening 110a, so as to electrically contact the drain D. Furthermore, the second electrode 170 is electrically isolated from the first electrode 130 by the second protection layer 140 and the isolator 160, so it is difficult for the second electrode 170 to electrically contact the first electrode 130 to result in a short circuit as in the conventional art.

In this embodiment, the first electrode 130 may be a planar electrode, and the second electrode 170 may have a plurality of slits 170a. Each of the slits 170a exposes a portion of the first electrode 130. A potential difference between the first electrode 130 and the second electrode 170 may result in fringe fields between the slits 170a and the first electrode 130, thereby driving a display medium (not shown) above the pixel structure 100. In other words, the pixel structure 100 of this embodiment may be a fringe-field switching (FFS) pixel structure. It should be noted that the illustration of the first electrode 130 and the second electrode 170 shown in FIGS. 1G and 2G are merely shown as an example to describe the invention, instead of serving to limit the invention. No matter how the first electrode 130 and the second electrode 170 are illustrated, the first and second electrodes fall within the protection scope of the invention as long as the second electrode 170 is electrically connected to the drain D through the opening 140a of the second protection layer 140 and the first electrode 130 is located below the second electrode 170.

In this embodiment, the first electrode 130 may be electrically connected to a common voltage, and the second electrode 170 may be electrically connected to a driving voltage. The first electrode 130 and the second electrode 170 are overlapped to form a capacitor. The capacitor is a storage capacitor of the pixel structure 100. However, the invention is not limited thereto. In other embodiments, the first electrode 130 may also be electrically connected to the driving voltage, and the second electrode 170 may also be electrically connected to the common voltage. It should be noted that, in this embodiment, the first electrode 130 further covers the sidewall surface 120b of the planar layer 120 in addition to covering an upper surface 120c of the planar layer 120. In other words, an overlapped area between the first electrode 130 and the second electrode 170 is greater at a position corresponding to the second opening 120a. With the greater overlapped area, the capacitor formed by the first electrode 130 and the second electrode 170 may have a greater capacitance, thereby improving the performance of a display panel using the pixel structure 100.

FIGS. 3A to 3G are schematic top views illustrating a method for fabricating a pixel structure according to another embodiment of the invention. FIGS. 4A to 4G are schematic cross-sectional views illustrating a method for fabricating a pixel structure according to another embodiment of the invention. In particular, FIGS. 4A and 4G are respectively cross-sectional views along a cross-sectional line B-B' in FIGS. 3A to 3G. In the following, the method for fabricating the pixel structure according to another embodiment of the invention is described with reference to FIGS. 3A to 3G and FIGS. 4A to 4G.

The method for fabricating the pixel structure shown in FIGS. 3A to 3G and FIGS. 4A to 4G is similar to the method for fabricating the pixel structure shown in FIGS. 1A to 1G and FIGS. 2A to 2G. Thus, like or corresponding components are referred to by like or corresponding reference symbols. The method for fabricating the pixel structure shown in FIGS. 3A to 3G and FIGS. 4A to 4G and the method for fabricating the pixel structure shown in FIGS. 1A to 1G and FIGS. 2A to 2G differ in that formation an isolator 160A (shown in FIG. 4F) is different from formation of the isolator 160 (shown in FIG. 2E). The following descriptions will focus on the difference, while the same parts between the method for fabricating the pixel structure shown in FIGS. 1A to 1G and FIGS. 2A to 2G and the method for fabricating the pixel structure shown in FIGS. 3A to 3G and FIGS. 4A to 4G may be referred to the foregoing descriptions based on the reference numerals in FIGS. 3A to 3G and FIGS. 4A to 4G and will not be repeated in the following.

Figure 3A:
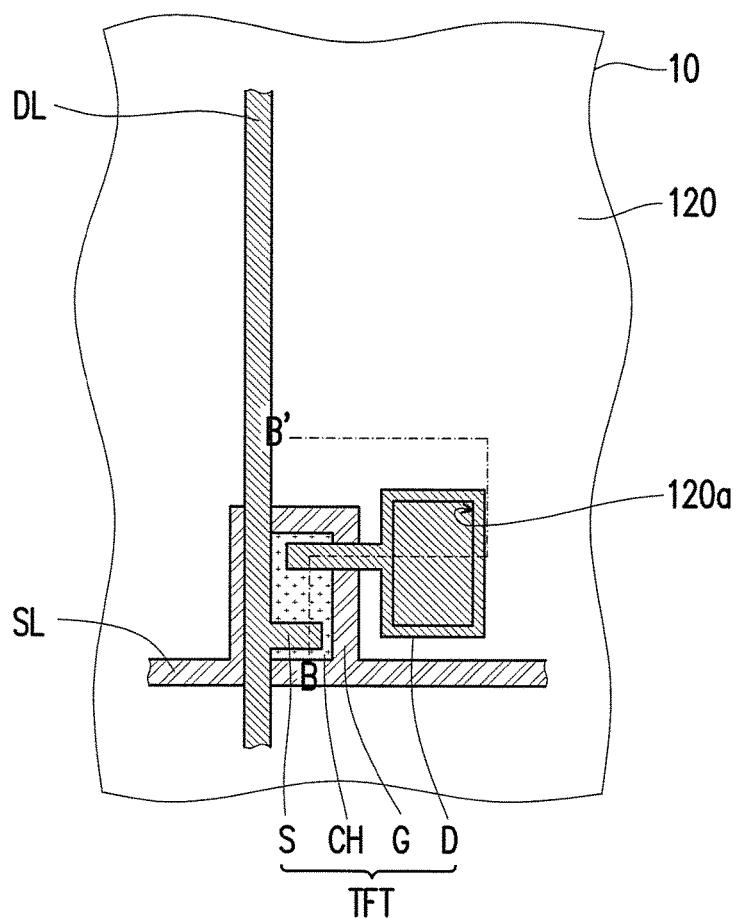
FIGS. 3A to 3G are schematic top views illustrating a method for fabricating a pixel structure according to another embodiment of the invention.
Figure 4A:
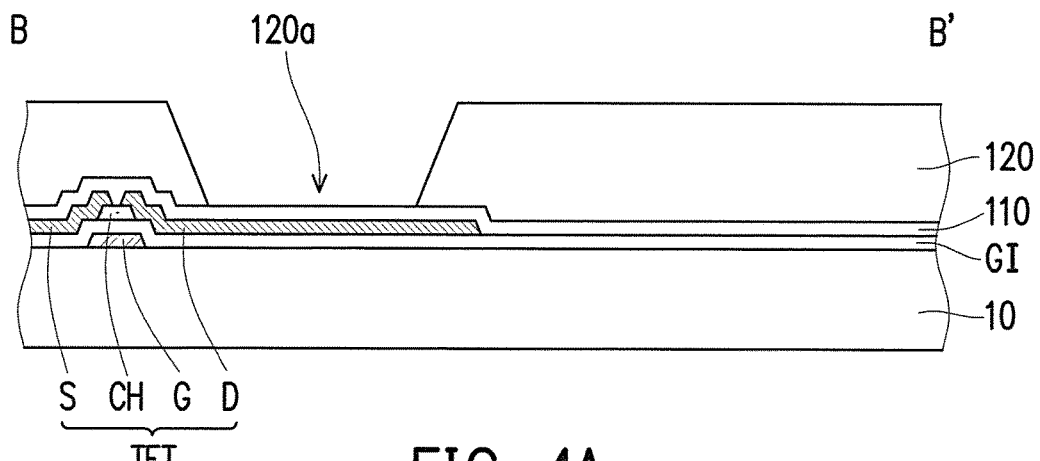
FIGS. 4A to 4G are schematic cross-sectional views illustrating a method for fabricating a pixel structure according to another embodiment of the invention.
Figure 3B:
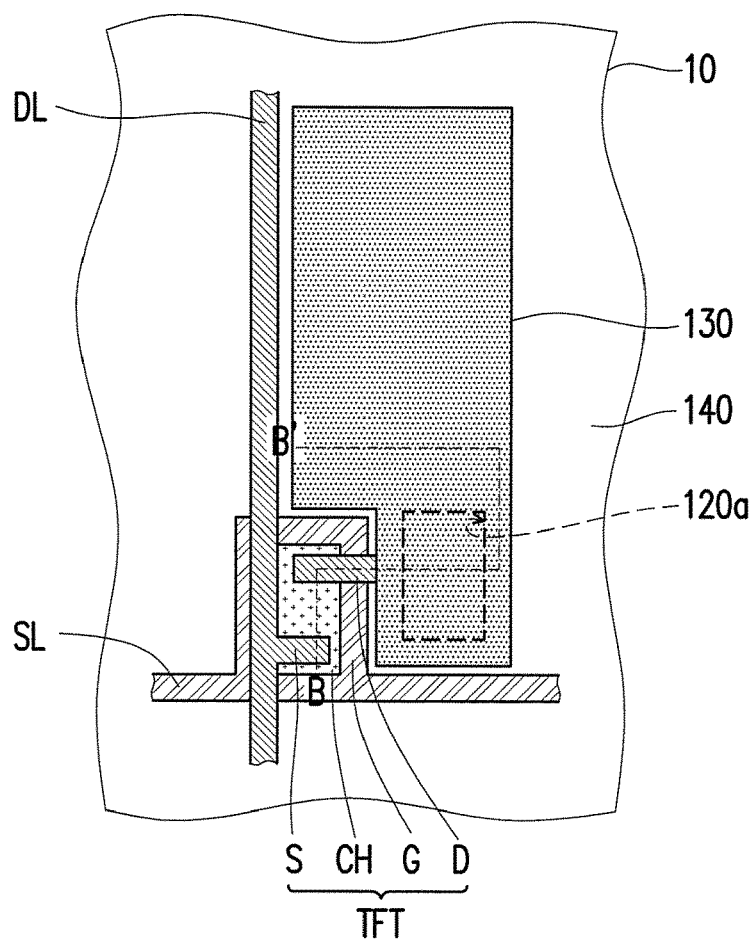
Figure 4B:
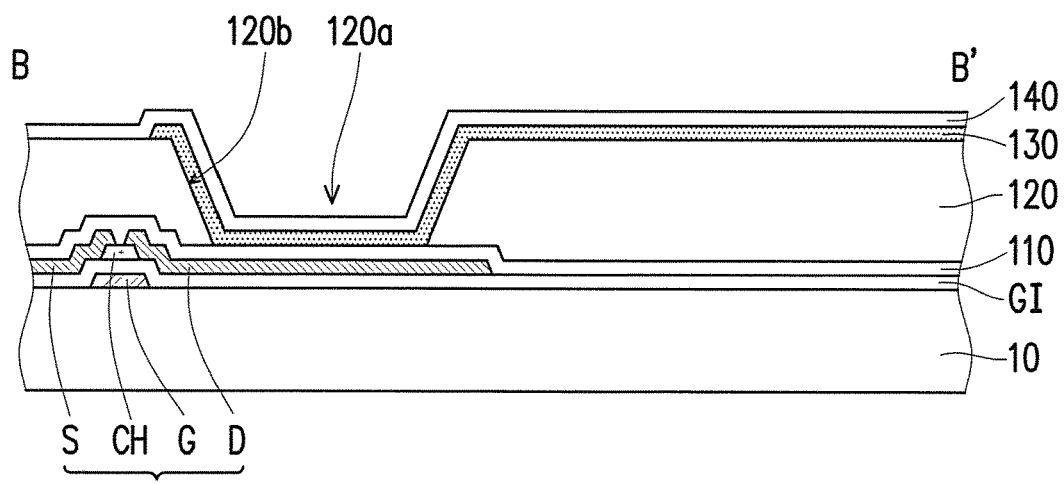

Firstly, referring to FIGS. 3A and 4A, the substrate 10 is provided. Then, the active device TFT is formed on the substrate 10. The active device TFT includes the gate G, the source S, and the drain D. Then, the first protection layer 110 is formed on the active device TFT. Then, the planar layer 120 is formed on the first protection layer 110. The planar layer has the second opening 120a. The second opening 120a exposes a portion of the first protection layer 110 above the drain D. Referring to FIGS. 3B and 4B, then, the patterned first electrode 130 is formed on the planar layer 120, and the second protection layer 140 is formed on the first electrode 130.

Figure 3C:
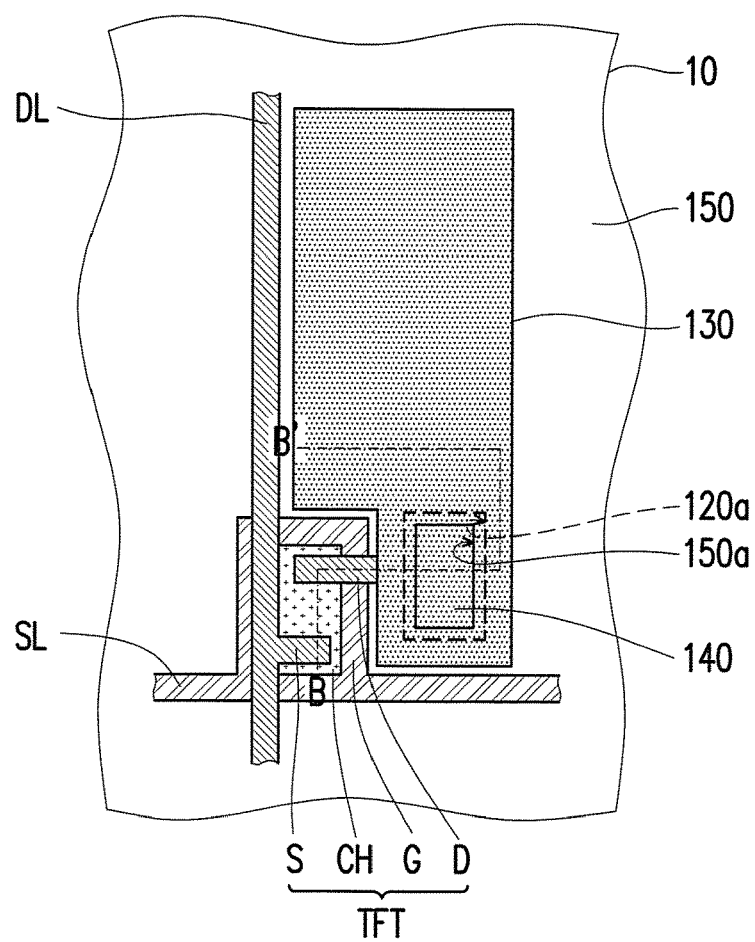
Figure 4C:
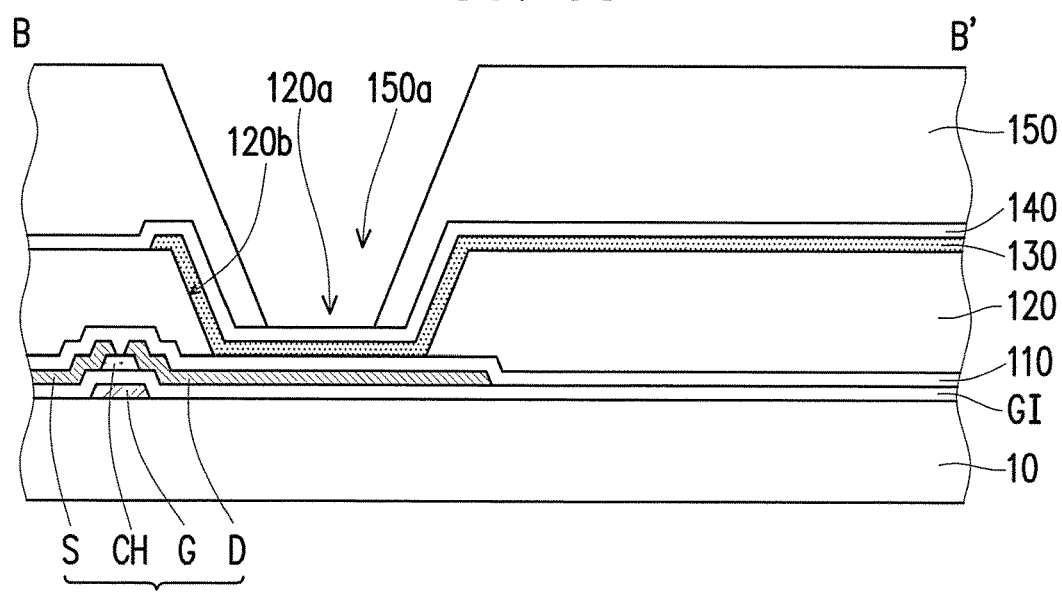
Figure 3D:
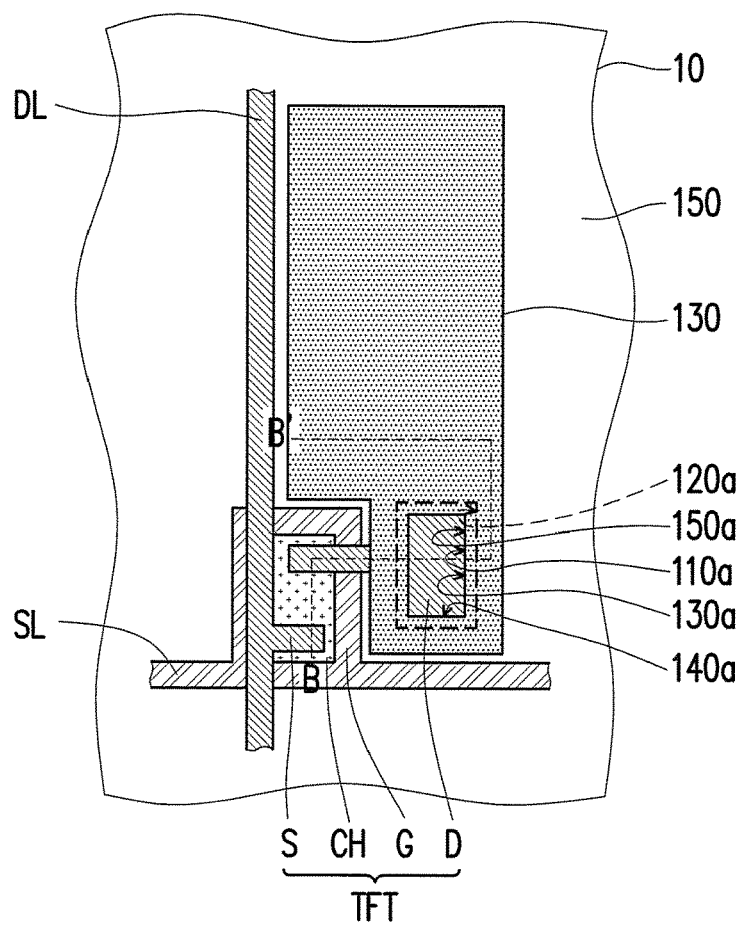
Figure 4D:
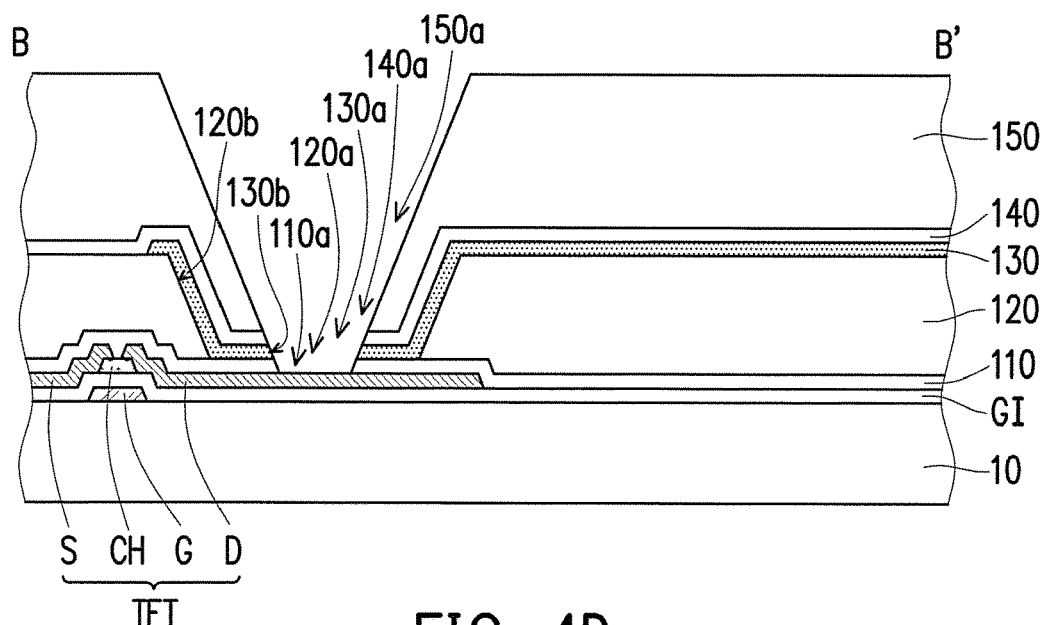

Referring to FIGS. 3C and 4C, then, the photoresist 150 is formed on the second protection layer 140. The photoresist 150 has the opening 150a. The opening 150a is overlapped with the second opening 120a of the planar layer 120 and the drain D of the active device TFT. The size of the opening 150a is smaller than the size of the second opening 120a. In addition, the opening 150a exposes a portion of the second protection layer 140. Referring to FIGS. 3D and 4D, then, a portion of the second protection layer 140 and a portion of the first electrode 130 located at the bottom portion of the second opening 120a are removed via the first opening 150a, and a portion of the first electrode 130 and a portion of the second protection layer 140 located at the sidewall surface 120b of the second opening 120a remain. More specifically, the photoresist 150 may be used as a mask to remove the portion of the second protection layer 140 exposed by the opening 150a, such that the second protection layer 140 has the opening 140a substantially aligned to the opening 150a. Then, using the same photoresist 150 as a mask, a portion of the first electrode 130 exposed by the openings 150a and 140a is removed, such that the first electrode 130 has the opening 130a substantially aligned to the openings 150a and 140a. What differs from the embodiment shown in FIGS. 1A to 1G and FIGS. 2A to 2G is that, in this embodiment, the portion of the first protection layer 110 exposed by the openings 130a, 140a, and 150a is removed by using the photoresist 150 as a mask before the isolator 160A (shown in FIG. 4F) is formed, so as to form the first opening 110a substantially aligned to the openings 130a, 140a, and 150a and exposing the drain D, unlike the embodiment shown in FIGS. 1A to 1G and FIGS. 2A to 2G where the isolator 160 (shown in FIG. 2E) is formed before the first opening 110a (shown in FIG. 2F) exposing the drain D is formed in the first protection layer 110.

Figure 3E:
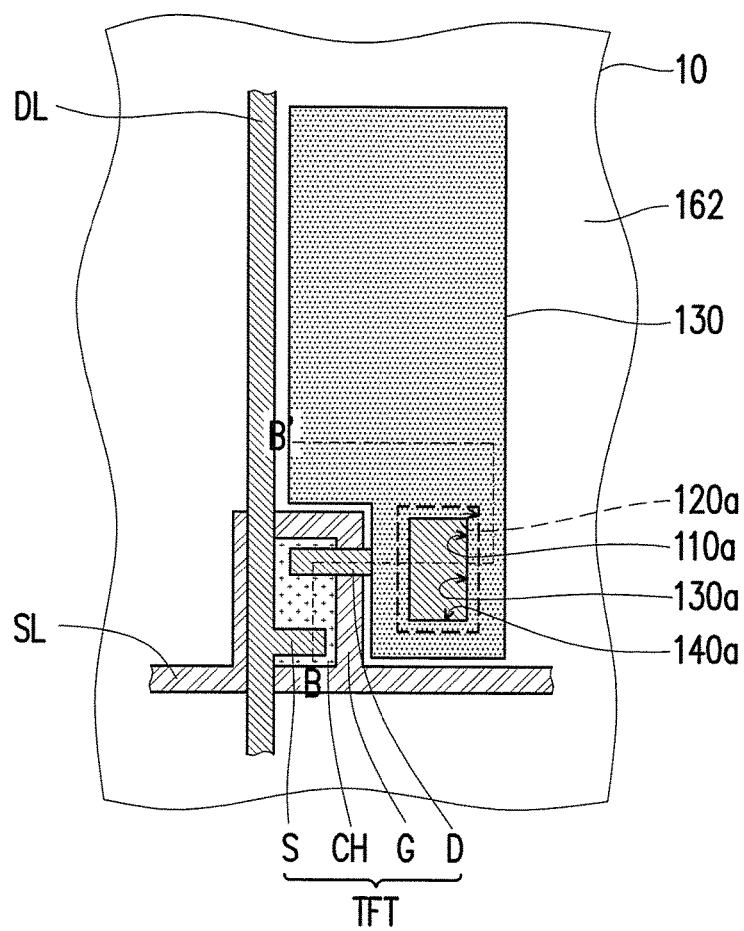
Figure 4E:
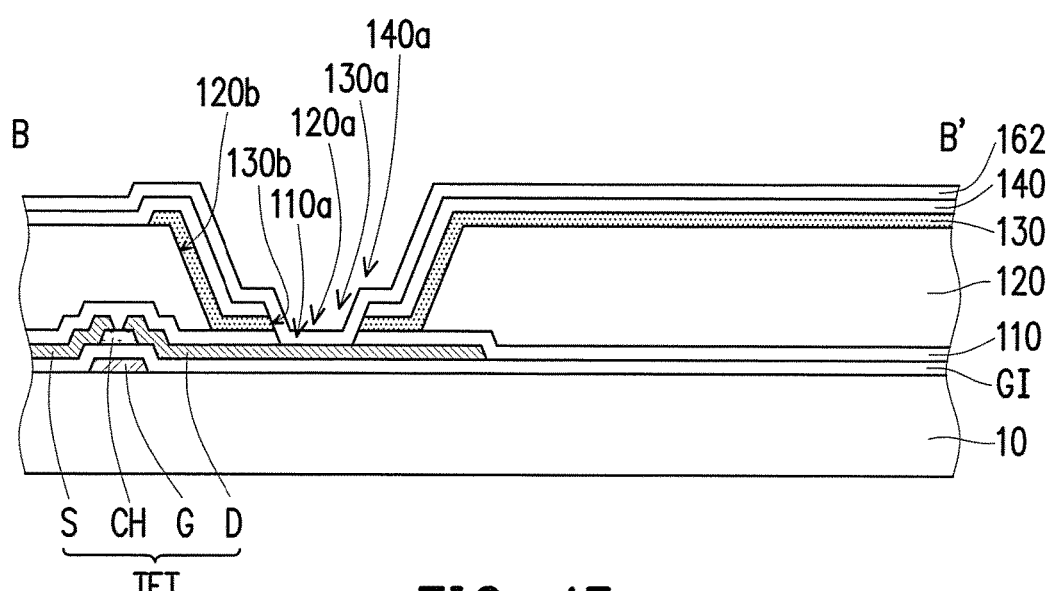
Figure 4F:
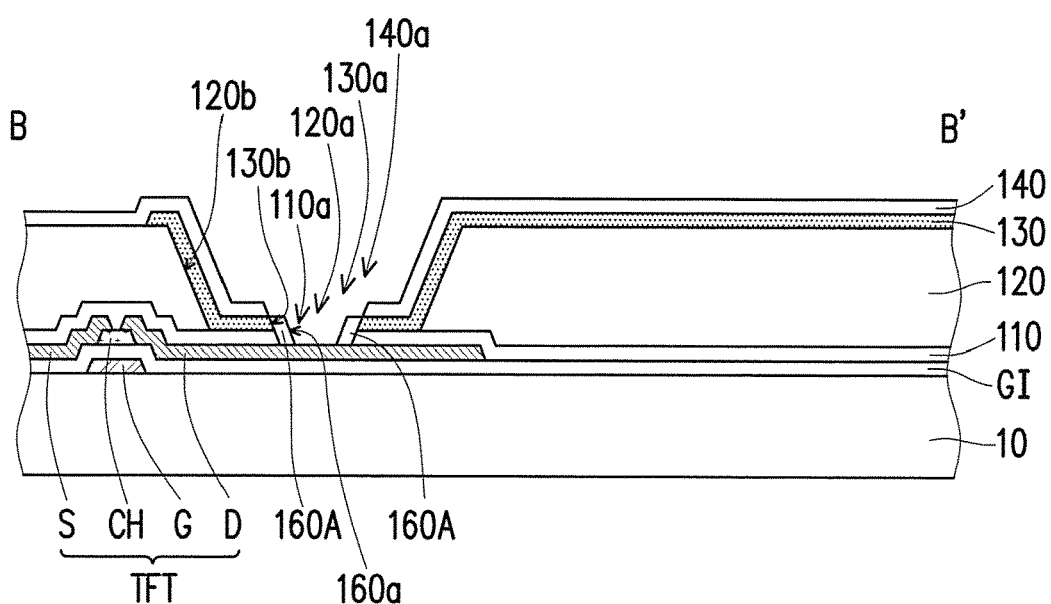
Figure 4G:
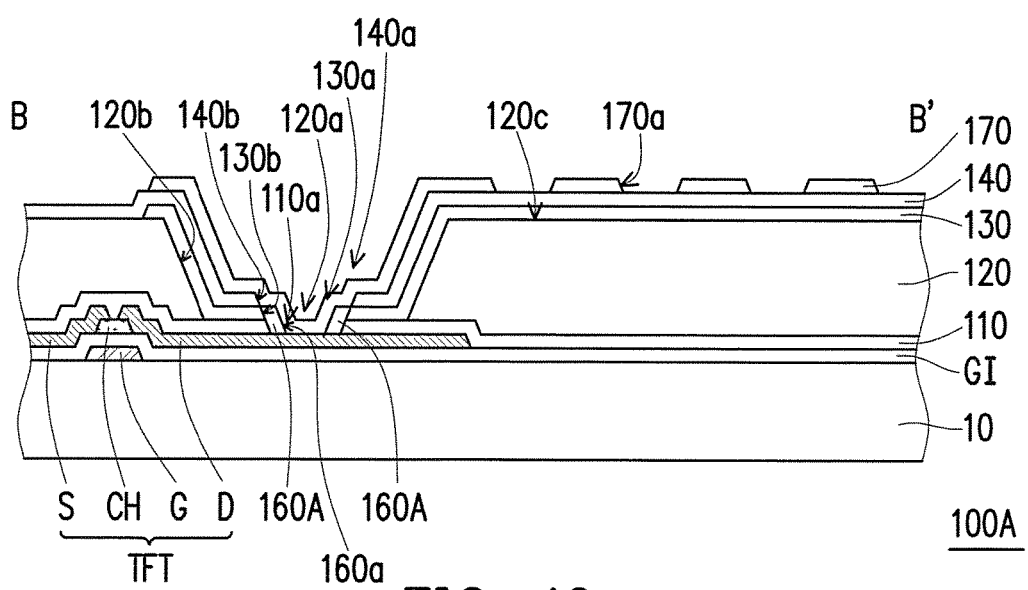

Referring to FIGS. 3E and 4E and FIGS. 3F and 4F, what differs from the embodiment shown in FIGS. 1A to 1G and FIGS. 2A to 2G is that, the isolator 160A (shown in FIGS. 3F and 4F) is formed by using a third protection layer 162 (shown in FIGS. 3E and 4E), unlike the isolator 160 in the embodiment shown in FIG. 2E that is formed by using the sidewall 130b of the first electrode 130. Specifically, referring to FIGS. 3D and 4D and FIGS. 3E and 4E, after forming the openings 140a and 130a and the first opening 110a, the photoresist 150 (shown in FIGS. 3D and 4D) is removed and the second protection layer 140 is exposed. Referring to FIGS. 3E and 4E, then, the third protection layer 162 is formed on the second protection layer 140 and covers the openings 140a and 130a and the first opening 110a. The third protection layer 162 covers the sidewall 130b of the first electrode 130 corresponding to the opening 130a. The third protection layer 162 may be formed of an inorganic material (e.g., silicon oxide, silicon nitride, silicon oxynitride, or a stack layer of at least two of the aforementioned materials), an organic material, or a combination thereof. Referring to FIGS. 3E and 4E and FIGS. 3F and 4F, a partial removal process is performed to the third protection layer 162 (shown in FIGS. 3E and 4E), so that a portion of the third protection layer 162 located at the sidewall 130b of the first electrode 130 remains as the isolator 160A (shown in FIGS. 3F and 4F). The isolator 160A at least covers the sidewall 130b of the first electrode 130, and an opening 160a of the isolator 160A exposes a portion of the drain D. In this embodiment, the partial removal process that removes a portion of the third protection layer 162 may be an anisotropic etching process, such as a dry etching process, for example. However, the invention is not limited thereto, in other embodiments, other suitable processes may be performed to remove a portion of the third protection layer 162, so as to form the isolator 160A.

Figure 3F:
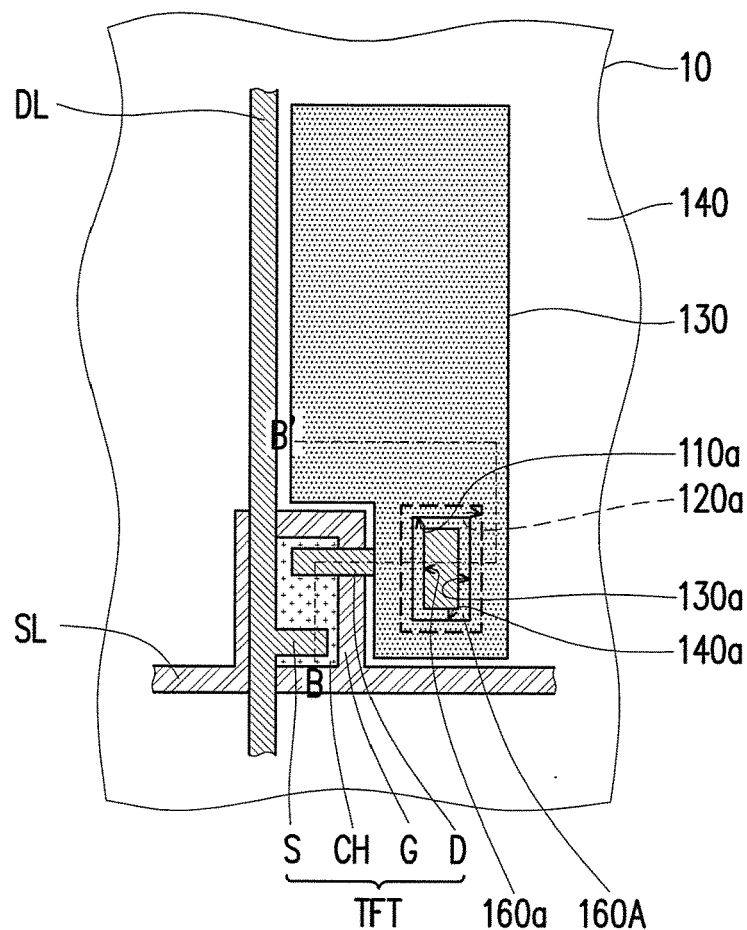
Figure 3G:
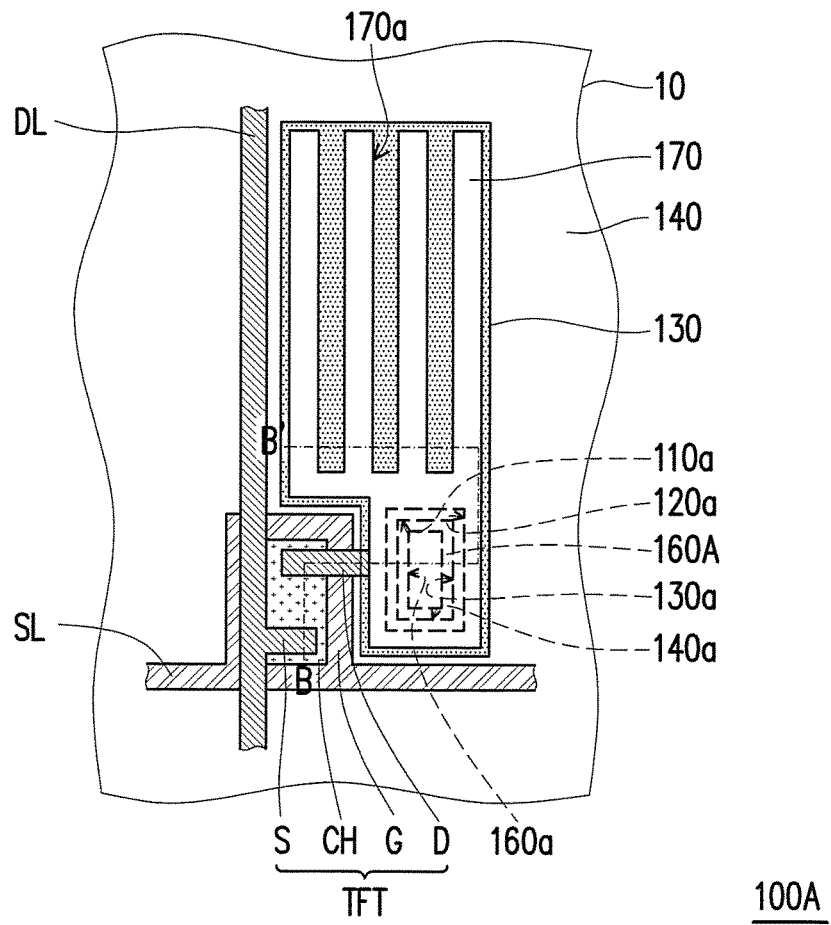

Referring to FIGS. 3G and 4G, then, the patterned second electrode 170 is formed on the second protection layer 140 and the isolator 160A. The second electrode 170 may be electrically connected to the drain D through the openings 140a and 130a, the first opening 110a, and the opening 160a of the isolator 160A. The second electrode 170 may be electrically isolated from the first electrode 130 by the second protection layer 140 and the isolator 160A. Accordingly, the pixel structure 100A of this embodiment is completed.

Referring to FIGS. 3G and 4G, the pixel structure 100A and the pixel structure 100 shown in FIGS. 1G and 2G are similar. Thus, like or corresponding components are referred to by like or corresponding reference numerals. The pixel structure 100A shown in FIGS. 3G and 4G and the pixel structure 100 shown in FIGS. 1G and 2G differ in that the isolator 160A shown in FIGS. 3G and 4G and the isolator 160 shown in FIGS. 1G and 2G are different. The following descriptions will focus on the difference, while the same parts between the pixel structure 100 shown in FIG. 1G and FIG. 2G and the pixel structure 100A shown in FIG. 3G and FIG. 4G may be referred to the foregoing descriptions based on the reference numerals in FIGS. 3G and 4G and will not be repeated in the following.

Referring to FIGS. 3G and 4G, the pixel structure 100A includes the active device TFT, the first protection layer 110, the first electrode 130, the isolator 160A, the second protection layer 140, and the second electrode 170. The active device TFT includes the gate G, the source S, and the drain D. The first protection layer 110 covers the active device TFT and has the first opening 110a, so as to expose the drain D. The first electrode 130 is located above the first protection layer 110. The first electrode 130 has the sidewall 130b at a position corresponding to the first opening 110a of the first protection layer 110. The sidewall 130b defines the boundary of the opening 130a. The isolator 160A at least covers the sidewall 130b of the first electrode 130. The second protection layer 140 covers the first electrode 130. The second electrode 170 is located on the second protection layer 140, and electrically connected to the drain D of the active device TFT through the opening 140a and the opening 160a. The second electrode 170 is electrically isolated from the first electrode 130 by the second protection layer 140 and the isolator 160A.

What differs from the embodiment shown in FIGS. 1G and 2G is that, unlike the isolator 160 sandwiched between the first and second protection layers 110 and 140 and the first electrode 130, as shown in FIG. 2G, the isolator 160A is disposed outside the first and second protection layers 110 and 140 and the first electrode 130, and covers the sidewall 130b of the first electrode 130 that defines the opening 130a and the sidewall 110b of the first protection layer that defines the first opening 110a. In the embodiment shown in FIGS. 3G and 4G, the isolator 160A does not cover the sidewall 140b of the second protection layer 140. However, the invention is not limited thereto. In other embodiments, the isolator 160A may also extend to be above the second protection layer 140 and cover the sidewall 140b. In general, whether the isolator 160A extends to be above the second protection layer 140, the isolator falls within the protection scope of the present application as long as the isolator covers the sidewall 130b of the first electrode 130, so that the second electrode 170 is electrically isolated from the first electrode 130, and the second electrode 170 fills into the opening 160a and is electrically connected to the drain D. The pixel structure 100A has similar effects and advantages as those of the pixel structure 100, and the effects and advantages are not repeated in the following.

FIGS. 5A to 5H are schematic top views illustrating a method for fabricating a pixel structure according to yet another embodiment of the invention. FIGS. 6A to 6H are schematic cross-sectional views illustrating a method for fabricating a pixel structure according to yet another embodiment of the invention. In particular, FIGS. 6A and 6H are respectively cross-sectional views along a cross-sectional line C-C' in FIGS. 5A to 5H. In the following, the method for fabricating the pixel structure according to another embodiment of the invention is described with reference to FIGS. 5A to 5H and FIGS. 6A to 6H.

The method for fabricating the pixel structure shown in FIGS. 5A to 5H and FIGS. 6A to 6H is similar to the method for fabricating the pixel structure shown in FIGS. 1A to 1G and FIGS. 2A to 2G. Thus, like or corresponding components are referred to by like or corresponding reference symbols. The method for fabricating the pixel structure shown in FIGS. 5A to 5H and FIGS. 6A to 6H and the method for fabricating the pixel structure shown in FIGS. 1A to 1G and FIGS. 2A to 2G differ in that a method of forming a isolator 160B (shown in FIG. 6H) is different from the method of forming the isolator 160 (shown in FIG. 2E). The following descriptions will focus on the difference, while the same parts between the method for fabricating the pixel structure shown in FIGS. 1A to 1G and FIGS. 2A to 2G and the method for fabricating the pixel structure shown in FIGS. 5A to 5H and FIGS. 6A to 6H may be referred to the foregoing descriptions based on the reference numerals in FIGS. 5A to 5H and FIGS. 6A to 6H and will not be repeated in the following.

Figure 5A:
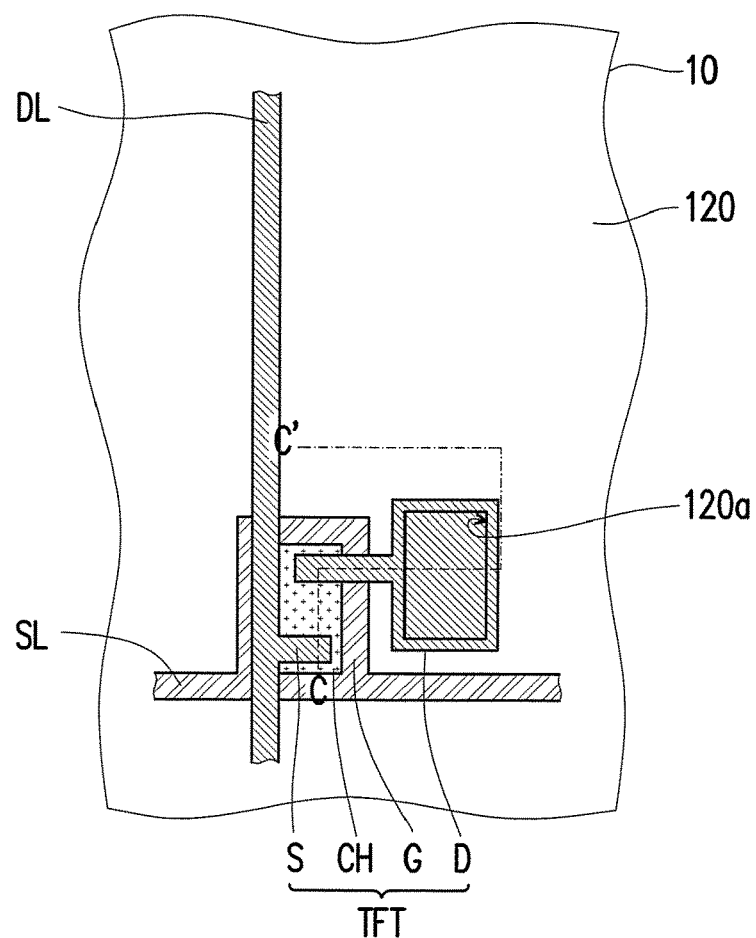
FIGS. 5A to 5H are schematic top views illustrating a method for fabricating a pixel structure according to yet another embodiment of the invention.
Figure 6A:
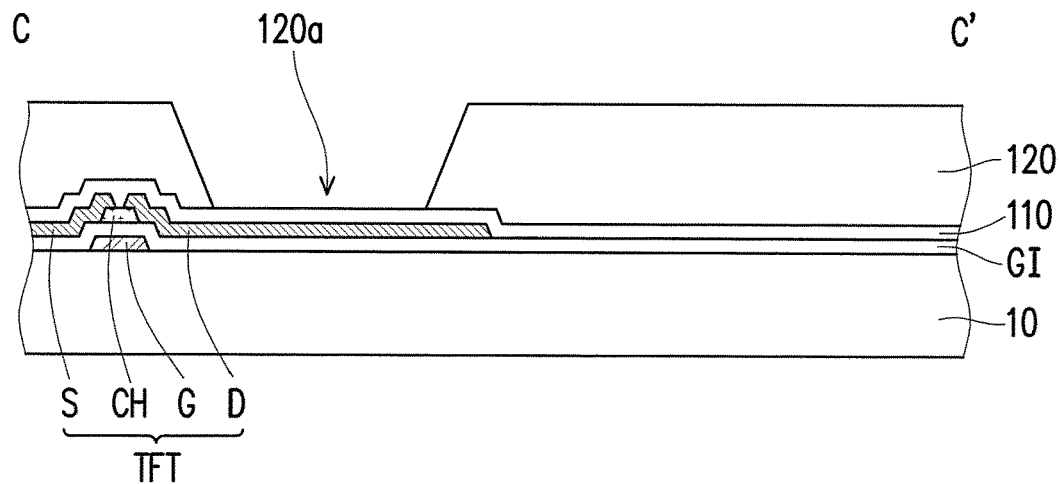
FIGS. 6A to 6H are schematic cross-sectional views illustrating a method for fabricating a pixel structure according to yet another embodiment of the invention.
Figure 5B:
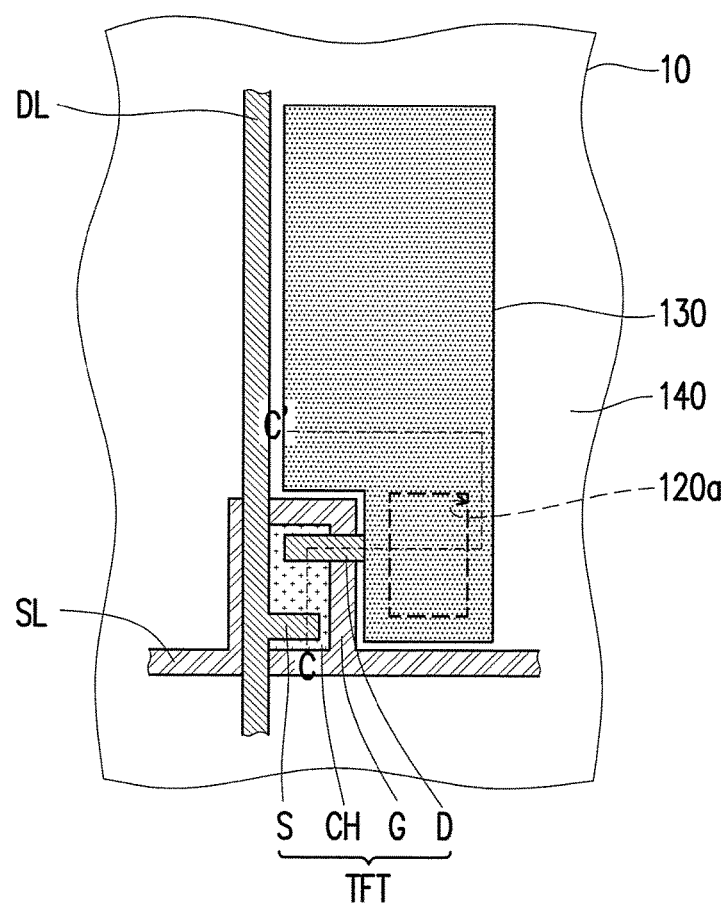
Figure 6B:
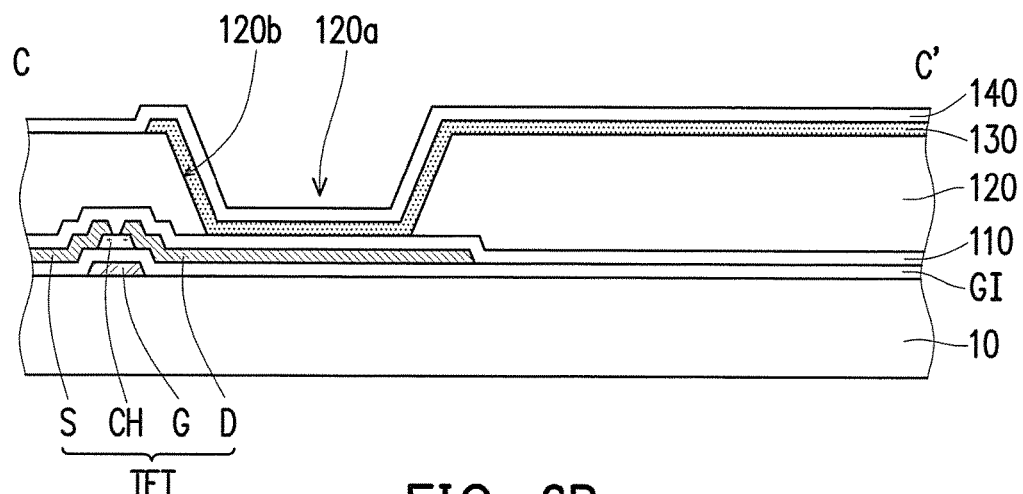

Firstly, referring to FIGS. 5A and 6A, the substrate 10 is provided. Then, an active device TFT is formed on the substrate 10. The active device TFT includes the gate G, the source S, and the drain D. Then, the first protection layer 110 is formed on the active device TFT. Then, the planar layer 120 is formed on the first protection layer 110. The planar layer has the second opening 120a. The second opening 120a exposes a portion of the first protection layer 110 above the drain D. Referring to FIGS. 5B and 6B, then, the patterned first electrode 130 is formed on the planar layer 120, and the second protection layer 140 is formed on the first electrode 130.

Figure 5C:
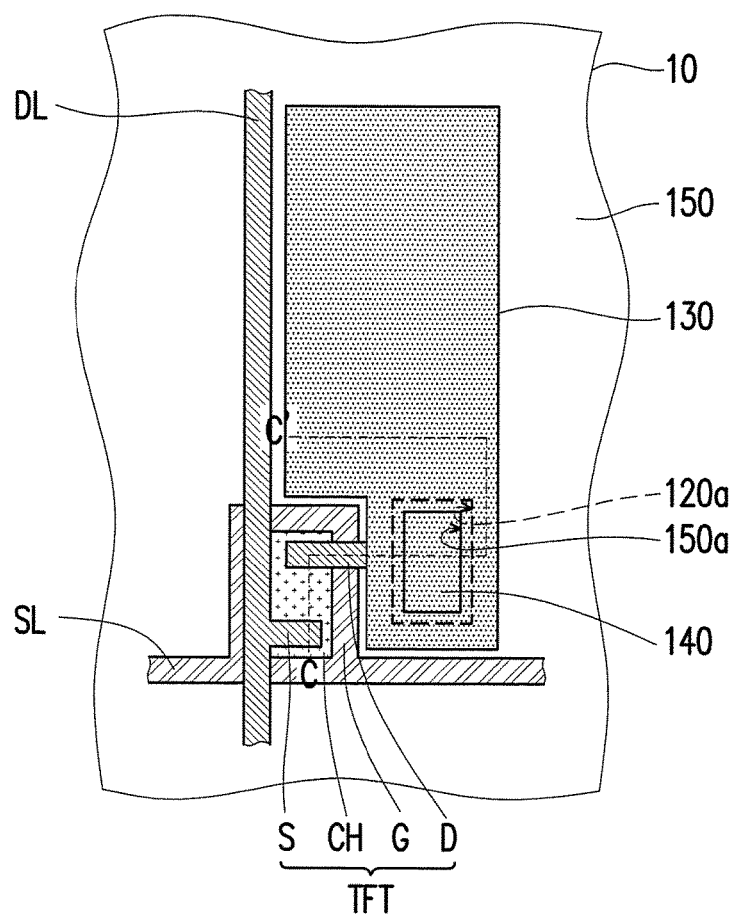
Figure 6C:
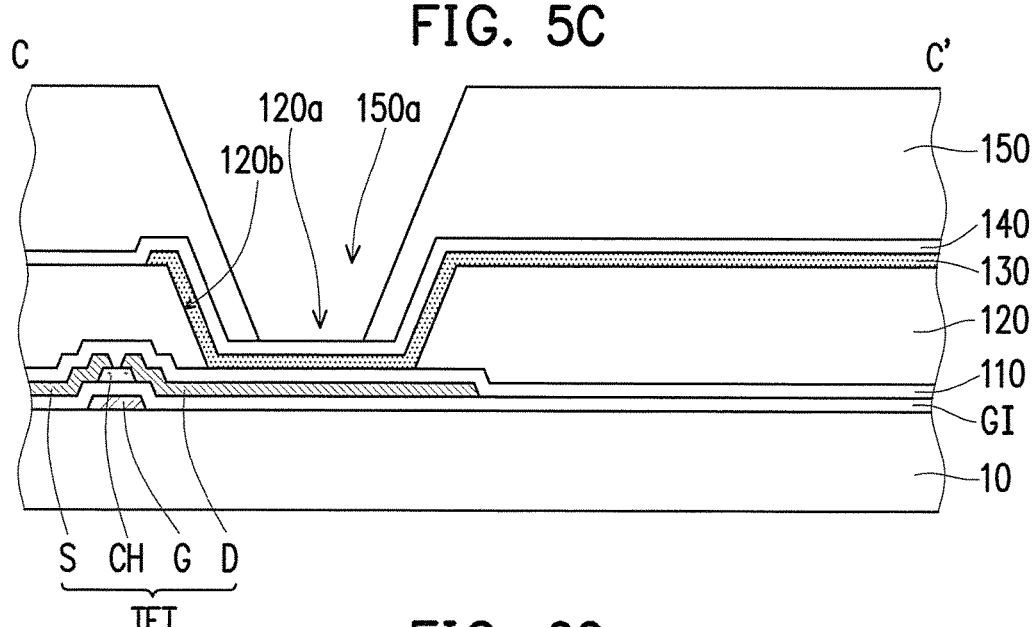
Figure 5D:
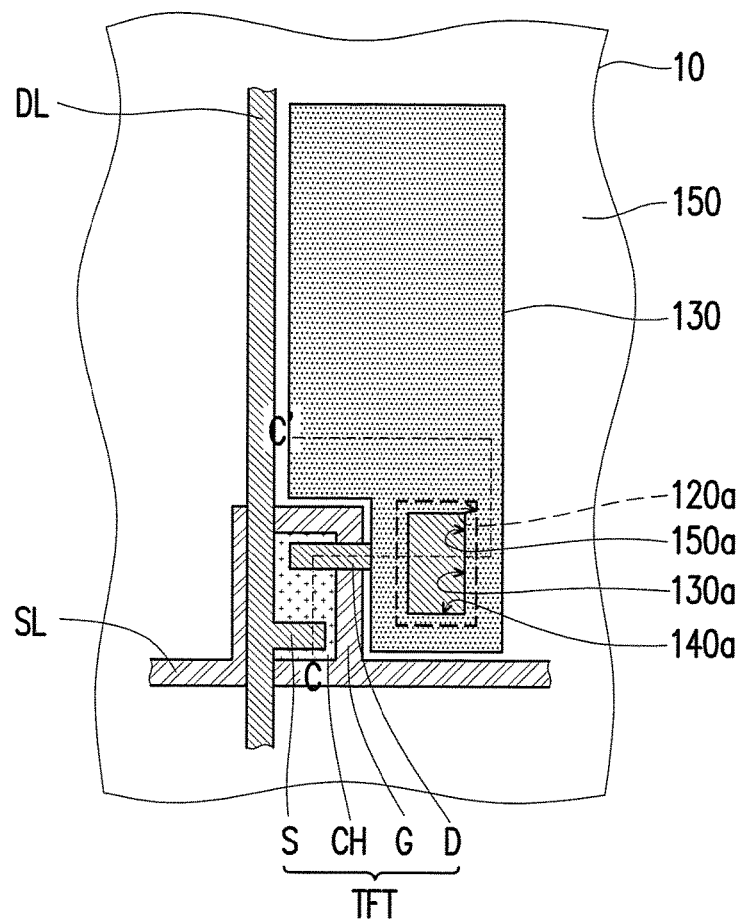
Figure 6D:
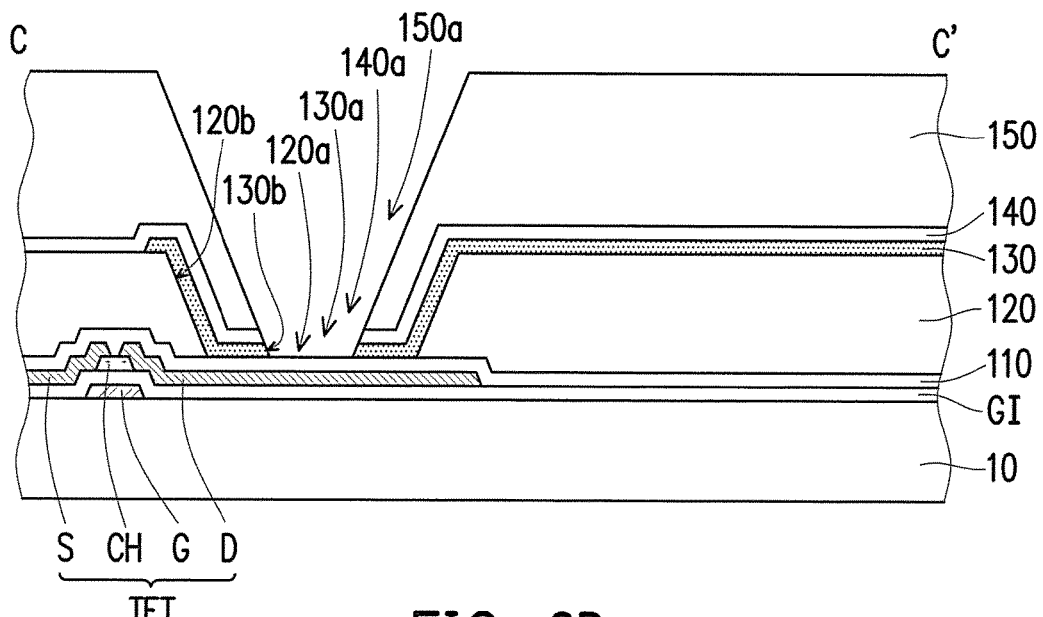
Figure 5E:
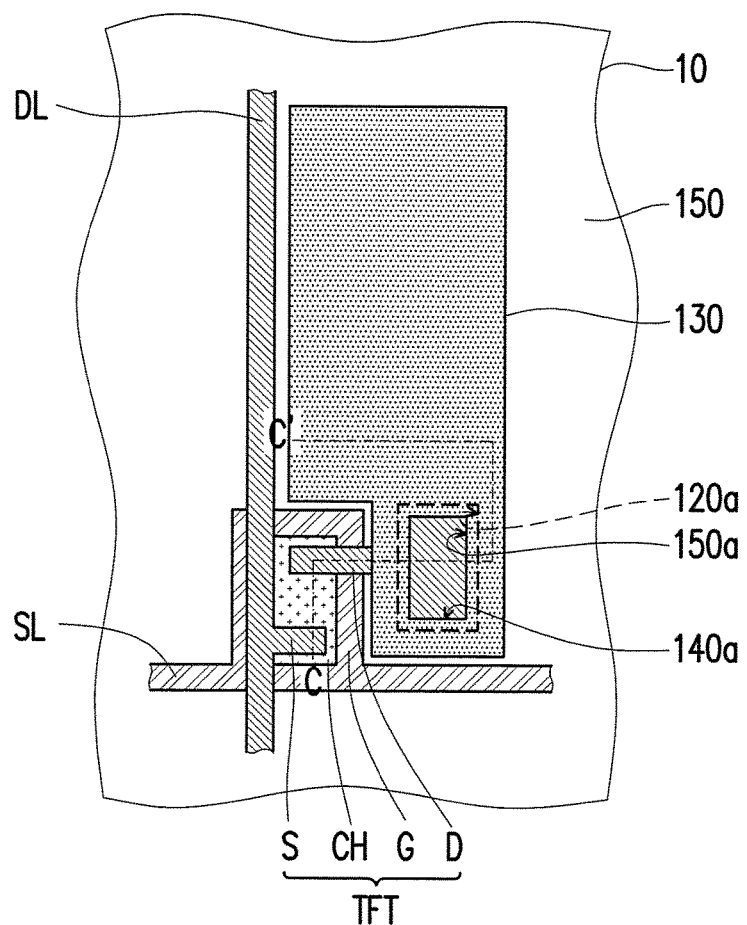

Referring to FIGS. 5C and 6C, then, the photoresist 150 is formed on the second protection layer 140. The photoresist 150 has the opening 150a. The opening 150a is overlapped with the second opening 120a of the planar layer 120 and the drain D of the active device TFT. The size of the opening 150a is smaller than the size of the second opening 120a. In addition, the opening 150a exposes a portion of the second protection layer 140. Referring to FIGS. 5D and 6D, then, a portion of the second protection layer 140 and a portion of the first electrode 130 located at the bottom portion of the second opening 120a are removed via the first opening 150a, and a portion of the first electrode 130 and a portion of the second protection layer 140 located at the sidewall surface 120b of the second opening 120a remain. More specifically, the photoresist 150 may be used as a mask to remove the portion of the second protection layer 140 exposed by the opening 150a, such that the second protection layer 140 has the opening 140a substantially aligned to the opening 150a. Then, using the same photoresist 150 as a mask, a portion of the first electrode 130 exposed by the openings 150a and 140a is removed, such that the first electrode 130 has the opening 130a substantially aligned to the openings 150a and 140a.

What differs from the embodiment shown in FIGS. 1A to 1G and FIGS. 2A to 2G is that, in this embodiment, a portion of the first electrode 130 adjacent to the opening 130a is further removed after the opening 130a is formed, so as to form the isolator 160B (shown in FIG. 6H) as a gap. The isolator 160B is thus different from the isolator 160 formed by using the sidewall 130b of the first electrode 130 in the embodiment shown in FIGS. 1A to 1G and FIGS. 2A to 2G.

Figure 6E:
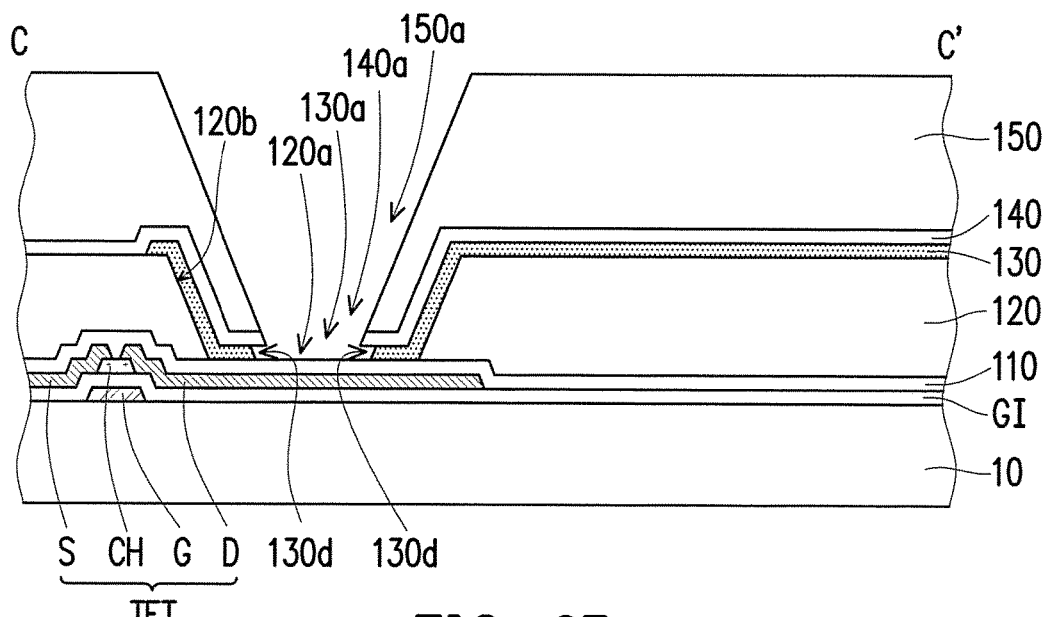

Specifically, referring to FIGS. 5D and 6D and FIGS. 5E and 6E, after the openings 130a and 140a are formed, a portion of the first electrode 130 at the openings 130a and 140a is further removed, so as to form an undercut structure 130d (shown in FIG. 6E). The undercut structure 130d is a recess between the first protection layer 110 and the second protection layer 140. For example, in this embodiment, the undercut structure 130d may be formed by over-etching the first electrode 130 using an etchant. However, the invention is not limited thereto. In other embodiments, other suitable processes may also be performed to form the undercut structure 130d.

Figure 5F:
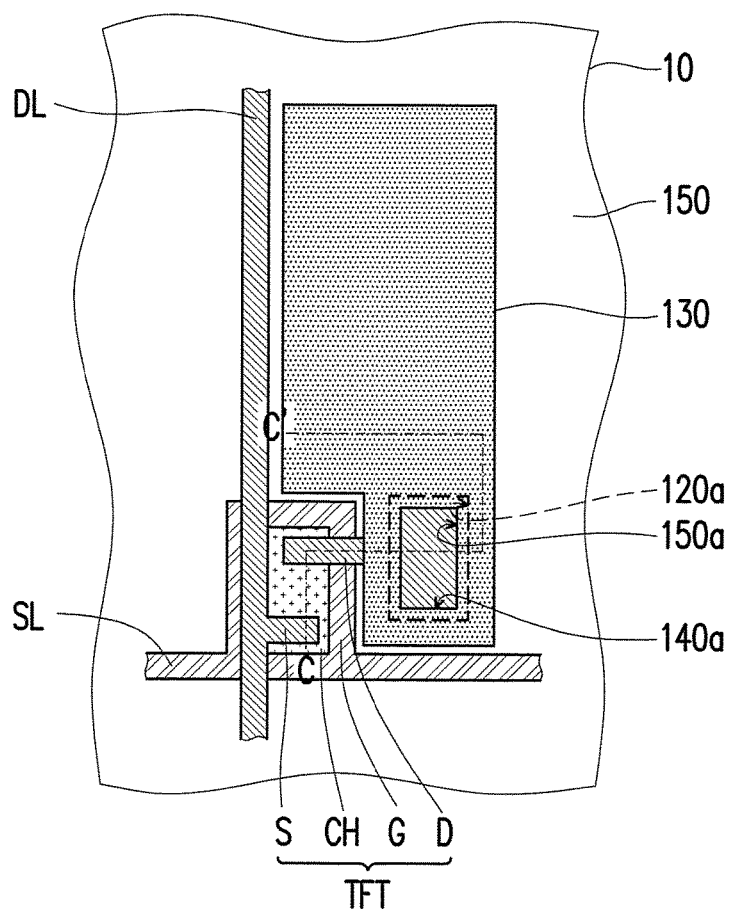
Figure 6F:
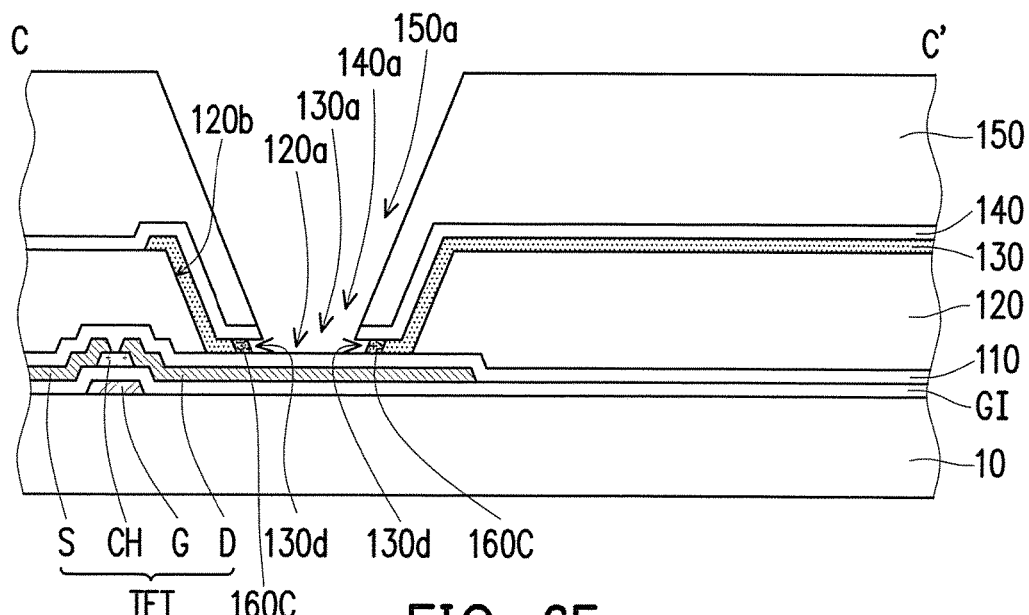
Figure 5G:
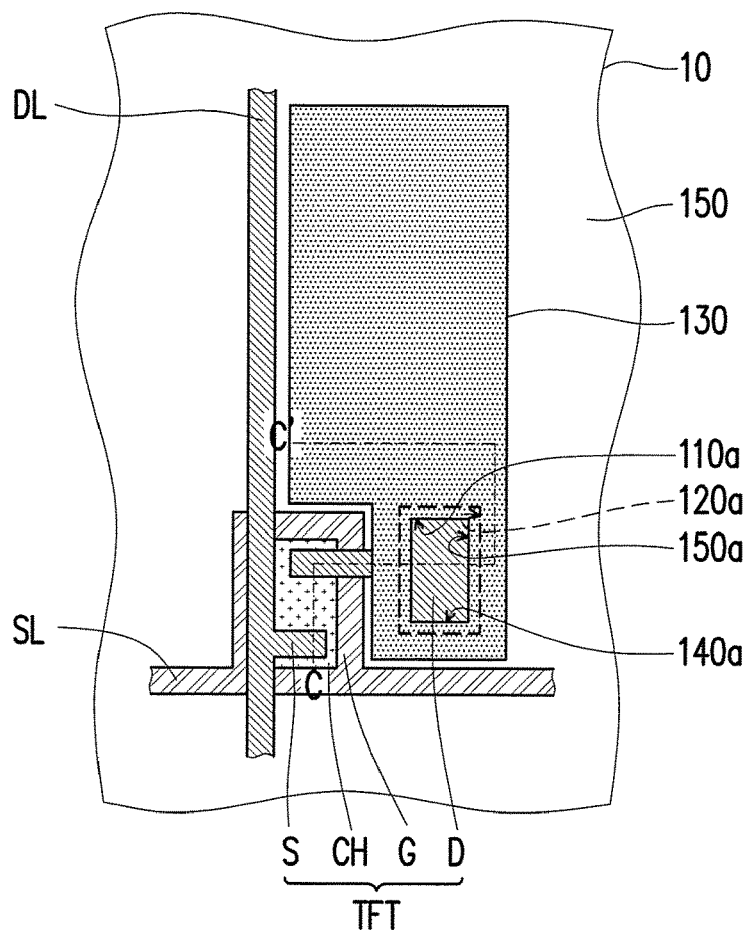
Figure 6G:
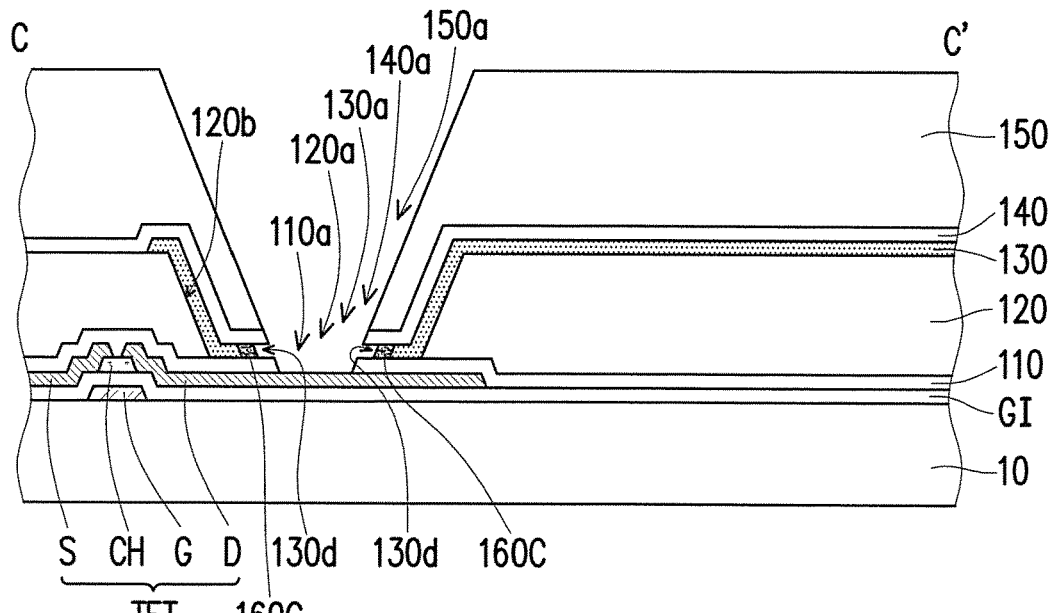
Figure 6H:
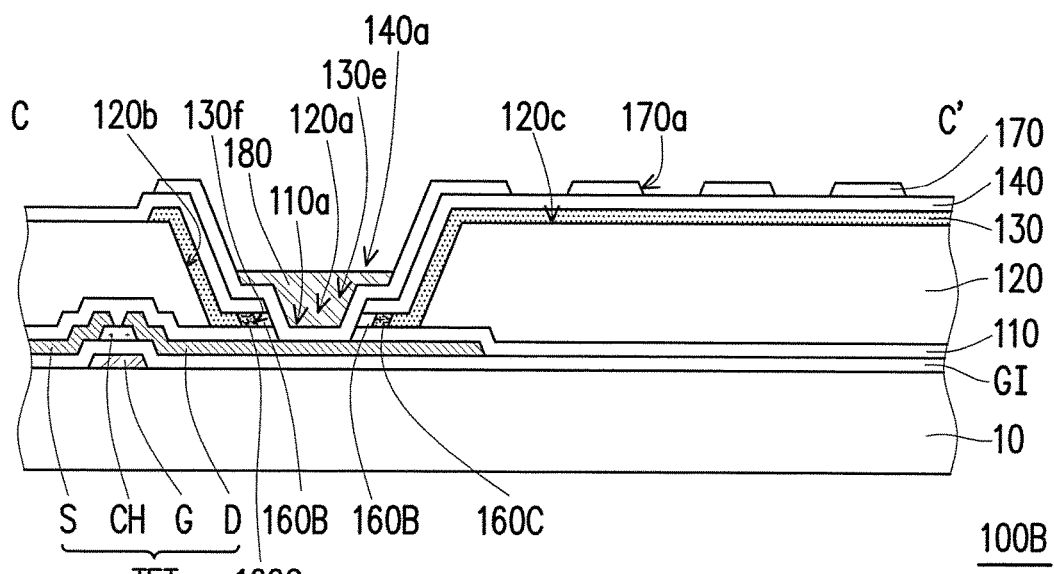

Referring to FIGS. 5F and 6F, in this embodiment, after the undercut structure 130d is formed, a passivation process is selectively performed to the first electrode 130, so as to form another isolator 160C by using a sidewall of the first electrode 130 that defines the undercut structure 130d. However, the invention is not limited thereto. In other embodiments, the isolator 160C may not be formed. Instead, after the undercut structure 130d (shown in FIG. 6E) is formed, the step of forming the isolator 160C in FIG. 6F is omitted, and the corresponding steps performed subsequently as shown in FIGS. 6G and 6H are directly performed.

Figure 5H:
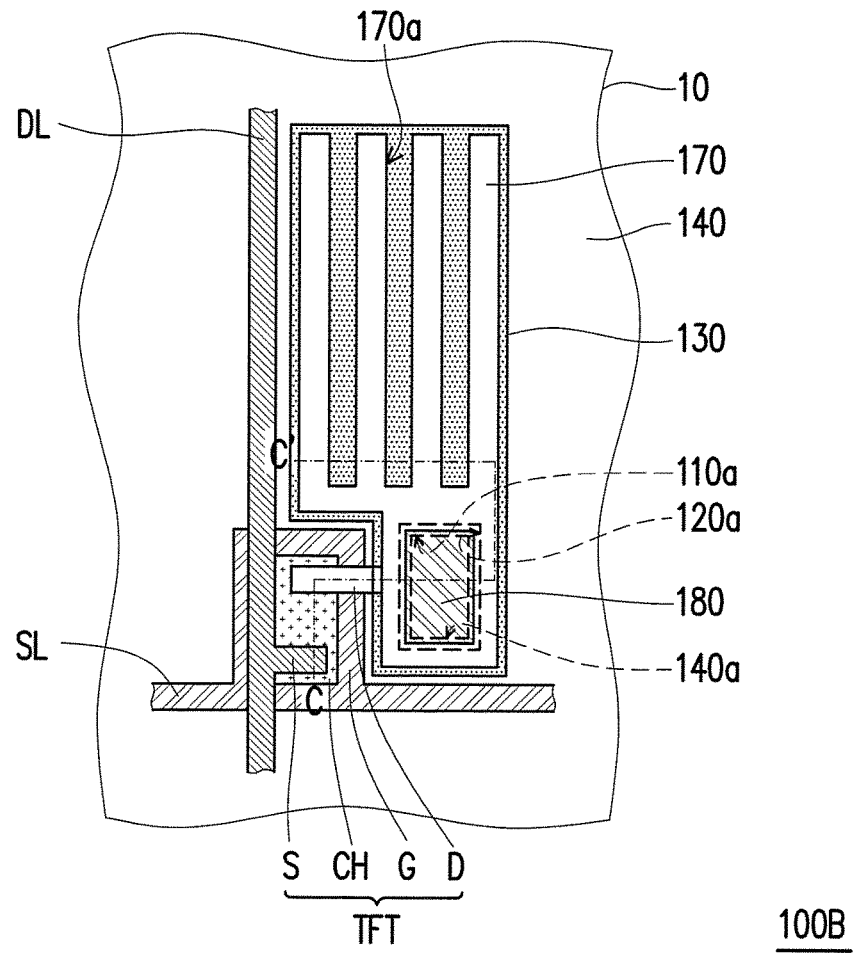

Referring to FIGS. 5F and 6F and FIGS. 5G and 6G, then, using the photoresist 150a as a mask, the portion of the first protection layer 110 exposed by the openings 150a, 140a, and 130a is removed, so as to form the first opening 110a exposing the drain D in the first protection layer 110. Referring to FIGS. 5G and 6G and FIGS. 5H and 6H, then, the photoresist 150 is removed to expose the second protection layer 140. Referring to FIGS. 5H and 6H, then, the patterned second electrode 170 is formed on the second protection layer 140, and the second electrode 170 is electrically connected to the drain D through the openings 140a and 130a and the first opening 110a. The second electrode 170 fills into the openings 140a and 130a and the first opening 110a, and covers the undercut structure 130d shown in FIG. 6E. In this way, a gap is formed between the second electrode 170 and the first electrode 130. The gap is the isolator 160B. The second electrode 170 is electrically isolated from the first electrode 130 by the second protection layer 140 and the isolators 160B and 160C. In this embodiment, the isolator 160B may be an air gap surrounded by the first electrode 130, the second electrode 170, the first protection layer 110, and the second protection layer 140. However, the component of the isolator 160B is not limited to air. The isolator 160B may also include other remaining gases in the process of fabricating the pixel structure 100B.

Referring to FIGS. 5H and 6H, then, a conductor 180 may be selectively formed on the second electrode 170 in the first opening 110a. Accordingly, the pixel structure 100B of this embodiment is completed. It should be mentioned that the conductor 180 may reinforce conductivity between the second electrode 170 and the drain D, thereby helping improve the reliability of the pixel structure 100B. The conductor 180 may be a conductive pattern formed by performing a photolithography process, a conductive adhesive, or other types of conductive materials. The invention does not intend to impose a limitation in this regard. It should be noted that formation of the conductor 180 is optional in the invention, and a method for fabricating a pixel structure without forming the conductor 180 is also included in the protection scope of the invention.

Referring to FIGS. 5H and 6H, the pixel structure 100B and the pixel structure 100 shown in FIGS. 1G and 2G are similar. Thus, like or corresponding components are referred to by like or corresponding reference numerals. The pixel structure 100B shown in FIGS. 5H and 6H and the pixel structure 100 shown in FIGS. 1G and 2G differ in that (1) the isolator 160B shown in FIGS. 5H and 6H and the isolator 160 shown in FIGS. 1G and 2G are different, and (2) the pixel structure 100B further includes the conductor 180. The following descriptions will focus on the difference, while the same parts between the pixel structure 100B shown in FIG. 5H and FIG. 6H and the pixel structure 100 shown in FIG. 1G and FIG. 2G may be referred to the foregoing descriptions based on the reference numerals in FIGS. 5H and 6H and will not be repeated in the following.

Referring to FIGS. 5H and 6H, the pixel structure 100B includes the active device TFT, the first protection layer 110, the first electrode 130, the isolator 160B, the second protection layer 140, and the second electrode 170. The active device TFT includes the gate G, the source S, and the drain D. The first protection layer 110 covers the active device TFT and has the first opening 110a, so as to expose the drain D. The first electrode 130 is located above the first protection layer 110. The first electrode 130 has a sidewall 130f at a position corresponding to the first opening 110a of the first protection layer 110. The size of an opening 130e defined by the sidewall 130f is greater than the size of the first opening 110a of the first protection layer 110 and the size of the opening 140a of the second protection layer 140. The isolator 160B covers the sidewall 130f of the first electrode 130. The second protection layer 140 covers the first electrode 130 and the isolator 160B. The second electrode 170 is located on the second protection layer 140, and electrically connected to the drain D of the active device TFT through the openings 140a and 130e and the first opening 110a. The second electrode 170 is electrically isolated from the first electrode 130 by the second protection layer 140 and the isolators 160B and 160C. It should be noted that, in other embodiments, fabrication of the isolator 160C may also be optionally omitted, and the pixel structure 100B omitting the isolator 160C also falls within the protection scope of the invention.

What differs from the embodiment shown in FIGS. 1G and 2G is that the isolator 160B is a gap between the first electrode 130 and the second electrode 170. More specifically, in this embodiment, the isolator 160B may be a gas sealed by the first electrode 130, the second electrode 170, the first protection layer 110, and the second protection layer 140. The component of the isolator 160B is not limited to air including oxygen and nitrogen. The isolator 160B may also include other remaining gases in the process of fabricating the pixel structure 100B. The pixel structure 100B of this embodiment may further include the conductor 180. The conductor 180 is located on the second electrode 170 and in the first opening 110a. The conductor 180 may be electrically connected to the second electrode 170 and the drain D. It should be noted that the invention does not intend to impose a limitation that the pixel structure is required to include the conductor 180. In other words, the pixel structure 100B that does not include the conductor 180 also falls within the protection scope of the invention. The pixel structure 100B has similar effects and advantages as those of the pixel structure 100, and the effects and advantages are not repeated in the following.

In view of the foregoing, in the pixel structure and the method for fabricating the pixel structure according to the embodiments of the invention, the isolator is formed on the sidewall of the opening of the first electrode, and the second electrode above the first electrode is electrically isolated from the first electrode by the second protection layer and the isolator. Therefore, there is hardly a short circuit between the first electrode and the second electrode. Consequently, the yield rate and the performance of the pixel structure are improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pixel structure, comprising:
    an active device, comprising a gate, a source, and a drain;
    a first protection layer, covering the active device and having a first opening above the drain;
    a first electrode, located above the first protection layer, wherein the first electrode has a sidewall at a position corresponding to the first opening of the first protection layer;
    an isolator, covering the sidewall of the first electrode, wherein the isolator comprises zinc or titanium;
    a second protection layer, covering the first electrode;
    a second electrode, located on the second protection layer and electrically connected to the drain of the active device through the first opening, wherein the second electrode is electrically isolated from the first electrode by the second protection layer and the isolator; and
    a planar layer, located between the first protection layer and the second protection layer, wherein the planar layer has a second opening in communication with the first opening, the second opening has a sidewall surface, and the first electrode is located on the planar layer and covers the sidewall surface of the second opening.

2. The pixel structure as claimed in claim 1, wherein the isolator is located between the first protection layer and the second protection layer.

3. The pixel structure as claimed in claim 2, wherein a thickness of the isolator is substantially equal to a thickness of the first electrode.

4. The pixel structure as claimed in claim 2, wherein a resistance of the isolator is greater than $10^{10}$ Ω-cm.

5. The pixel structure as claimed in claim 1, wherein the isolator is located in the first opening and covers a portion of the first electrode and a portion of the first protection layer.

6. The pixel structure as claimed in claim 1, further comprising a conductor located on the second electrode and in the first opening.

7. The pixel structure as claimed in claim 1, wherein a size of the second opening of the planar layer is greater than a size of the first opening of the first protection layer.

8. The pixel structure as claimed in claim 1, wherein the isolator further comprises a gap located between the first electrode and the second electrode.

9. The pixel structure as claimed in claim 1, wherein the first electrode is electrically connected to a common voltage, and the first electrode overlaps the second electrode to constitute a capacitor.

10. A method for fabricating a pixel structure, comprising:
    forming an active device on a substrate, wherein the active device comprises a gate, a source, and a drain;
    forming a first protection layer on the active device;
    forming a first electrode above the first protection layer;
    forming a second protection layer on the first electrode;
    patterning the second protection layer and the first electrode to form an opening exposing the first protection layer above the drain, wherein the first electrode has a sidewall at the opening;
    forming an isolator with zinc or titanium on the sidewall of the first electrode;
    removing the first protection layer exposed by the opening, so as to form a first opening in the first protection layer to expose the drain;
    forming a second electrode on the second protection layer, wherein the second electrode is electrically connected to the drain through the first opening, and the second electrode is electrically isolated from the first electrode by the second protection layer and the isolator;
    forming a planar layer on the first protection layer, wherein the planar layer has a second opening;
    forming the first electrode and the second protection layer on the planar layer, wherein the first electrode and the second protection layer cover a surface of the second opening; and
    removing the second protection layer and the first electrode at a bottom portion of the second opening, while keeping the first electrode and the second protection layer at a sidewall surface of the second opening.

11. The method for fabricating the pixel structure as claimed in claim 10, wherein the step of forming the isolator on the sidewall of the first electrode comprises:
    after forming the first opening, performing a passivation process, such that the sidewall of the first electrode is passivated to form the isolator.

12. The method for fabricating the pixel structure as claimed in claim 11, wherein the passivation process comprises a $H_2$ plasma treatment, a $NH_3$ plasma treatment, or a $SiH_4$ plasma treatment.

13. The method for fabricating the pixel structure as claimed in claim 10, wherein:
    patterning the second protection layer and the first electrode further comprises patterning the first protection layer, so as to form the first opening, wherein the first opening exposes the drain,
    a third protection layer is further formed on the second protection layer, wherein the third protection layer covers the drain and the sidewall of the first electrode located at the opening, and
    a partial removal process is performed to the third protection layer, so that a portion of the third protection layer located at the sidewall of the first electrode remains as the isolator and the drain is exposed.

14. The method for fabricating the pixel structure as claimed in claim 13, wherein the partial removal process comprises a dry etching process.

15. The method for fabricating the pixel structure as claimed in claim 10, wherein the step of forming the isolator on the sidewall of the first electrode comprises:
    after forming the opening, removing the first electrode at the opening to form an undercut structure; and
    after foil ling the second electrode on the second protection layer, the second electrode covers the undercut structure to form a gap between the second electrode and the first electrode.

16. The method for fabricating the pixel structure as claimed in claim 10, further comprising forming a conductor on the second electrode in the first opening.

17. The method for fabricating the pixel structure as claimed in claim 10, wherein a size of the second opening of the planar layer is greater than a size of the first opening of the first protection layer.

* * * * *